(12) United States Patent
Takahashi et al.

(10) Patent No.: US 9,221,214 B2
(45) Date of Patent: Dec. 29, 2015

(54) METHOD FOR PRODUCING CONCAVE-CONVEX SUBSTRATE USING SOL-GEL METHOD, SOL USED IN SAME, METHOD FOR PRODUCING ORGANIC EL ELEMENT USING SAME, AND ORGANIC EL ELEMENT OBTAINED THEREBY

(71) Applicant: JX NIPPON OIL & ENERGY CORPORATION, Tokyo (JP)

(72) Inventors: Madoka Takahashi, Tokyo (JP); Yoshihiro Kumagai, Yokohama (JP); Suzushi Nishimura, Yokohama (JP)

(73) Assignee: JX NIPPON OIL & ENERGY CORPORATION, Tokyo (JP)

( * ) Notice: Subject to any disclaimer, the term of this patent is extended or adjusted under 35 U.S.C. 154(b) by 0 days.

(21) Appl. No.: 14/259,656

(22) Filed: Apr. 23, 2014

(65) Prior Publication Data

US 2014/0231776 A1 Aug. 21, 2014

Related U.S. Application Data

(63) Continuation of application No. PCT/JP2012/070854, filed on Aug. 16, 2012.

(30) Foreign Application Priority Data

| Oct. 31, 2011 | (JP) | 2011-239567 |
| Nov. 11, 2011 | (JP) | 2011-247074 |
| Jul. 10, 2012 | (JP) | 2012-154873 |
| Jul. 10, 2012 | (JP) | 2012-154880 |

(51) Int. Cl.
*H01L 51/52* (2006.01)
*B29C 59/02* (2006.01)
(Continued)

(52) U.S. Cl.
CPC ............. *B29C 59/022* (2013.01); *B29C 59/026* (2013.01); *B29C 59/046* (2013.01);
(Continued)

(58) Field of Classification Search
CPC ... H01L 31/02327; H01L 33/58; H01L 51/52; H01L 51/5206; H01L 51/5275; H01L 51/56
See application file for complete search history.

(56) References Cited

U.S. PATENT DOCUMENTS

| 6,989,114 B1 | 1/2006 | Korenaga et al. |
| 2005/0232867 A1 | 10/2005 | Gyurik et al. |

(Continued)

FOREIGN PATENT DOCUMENTS

| EP | 1 174 258 A1 | 1/2002 |
| JP | A-2001-26052 | 1/2001 |

(Continued)

OTHER PUBLICATIONS

Nov. 4, 2014 Office Action issued in Japanese Application No. 2012-154880.

(Continued)

*Primary Examiner* — Kyoung Lee
(74) *Attorney, Agent, or Firm* — Oliff PLC

(57) ABSTRACT

A method for producing a substrate having a concavity and convexity pattern includes: a step for applying a sol containing a silica precursor on a substrate to form a coating film; a step for drying the coating film; a pressing step for pressing a mold having a concavity and convexity pattern against the dried coating film with a pressing roll; a step for peeling off the mold from the coating film; and a step for baking the coating film to which the concavity and convexity pattern has been transferred. The coating film is dried in the drying step so that the ratio of weight of the coating film to dried weight of the coating film is in a range of 1.4 to 8.8, the dried weight being obtained by baking the coating film at a temperature of 100 degrees Celsius. The coating film may be heated in the pressing step.

16 Claims, 16 Drawing Sheets

(51) Int. Cl.
  *B29C 59/04* (2006.01)
  *H01L 51/00* (2006.01)
  *H01L 51/56* (2006.01)
  *B29C 35/02* (2006.01)
  *B29C 35/04* (2006.01)
  *B29C 35/08* (2006.01)

(52) U.S. Cl.
  CPC ........ *H01L51/0014* (2013.01); *H01L 51/5262* (2013.01); *H01L 51/5275* (2013.01); *H01L 51/56* (2013.01); *B29C 35/02* (2013.01); *B29C 2035/046* (2013.01); *B29C 2035/0822* (2013.01)

(56) References Cited

U.S. PATENT DOCUMENTS

2008/0011934 A1*  1/2008  Verschuuren et al. ........ 249/134
2009/0162623 A1   6/2009  Foresti et al.
2012/0132897 A1   5/2012  Seki et al.

FOREIGN PATENT DOCUMENTS

| JP | A-2003-90902 | 3/2003 |
| JP | A-2008-49544 | 3/2008 |
| JP | A-2008-68611 | 3/2008 |
| JP | A-2009-517310 | 4/2009 |
| JP | A-2010-269480 | 12/2010 |
| JP | A-2011-6487 | 1/2011 |
| WO | WO 2011/007878 A1 | 1/2011 |

OTHER PUBLICATIONS

Nov. 4, 2014 Office Action issued in Japanese Application No. 2012-154873.
International Search Report issued in International Patent Application No. PCT/JP2012/070854 dated Oct. 23, 2012 (with translation).
Written Opinion issued in International Patent Application No. PCT/JP2012/070854 dated Oct. 23, 2012 (with translation).
Sep. 11, 2015 Search Report issued in European Patent Application No. 12845744.7.

* cited by examiner

METHOD FOR PRODUCING CONCAVE-CONVEX SUBSTRATE USING SOL-GEL METHOD, SOL USED IN SAME, METHOD FOR PRODUCING ORGANIC EL ELEMENT USING SAME, AND ORGANIC EL ELEMENT OBTAINED THEREBY

CROSS REFERENCE TO RELATED APPLICATION

This application is a continuation application of International Patent Application No. PCT/JP2012/070854 filed on Aug. 16, 2012 claiming the benefit of priority of Japanese Patent Applications No. 2011-239567 filed on Oct. 31, 2011, No. 2011-247074 filed on Nov. 11, 2011, No. 2012-154873 filed on Jul. 10, 2012 and No. 2012-154880 filed on Jul. 10, 2012. The contents of International Patent Application No. PCT/JP2012/070854 and Japanese Patent Applications No. 2011-239567, No. 2011-247074, No. 2012-154873 and No. 2012-154880 are incorporated herein by reference in their entities.

BACKGROUND OF THE INVENTION

1. Field of the Invention

The present invention relates to a method for producing a substrate having a minute or fine pattern by use of a transfer roll, a method for producing an organic EL element (Organic Electro-Luminescence element or organic light emitting diode) using the same, and the organic EL element obtained thereby. More specifically, the present invention relates to a method for producing a substrate having a minute or fine pattern by use of a transfer roll by a sol-gel method, a sol used for the producing method, a method for producing an organic EL element using the producing method, and the organic EL element obtained thereby.

2. Description of the Related Art

There has been known a lithography method as a method for forming a minute pattern such as a semiconductor integrated circuit. The resolution of the pattern formed by the lithography method is dependent on the wavelength of a light source and the numerical aperture of an optical system, and the light source is expected to have shorter wavelength in order to meet demand for miniaturized devices in recent years. However, the light source having the short wavelength is expensive, development thereof is not easy, and the development of an optical material transmitting such a short-wavelength light is also needed. Further, manufacturing a large-area pattern by a conventional lithography method needs a large-size optical element, and thus there are difficulties in technical and economic aspects. Therefore, a novel method for forming a desired pattern on a large area has been studied.

There has been known a nanoimprint method as a method for forming a minute pattern without using any conventional lithography apparatus. The nanoimprint method is a technique such that a pattern of an order of nanometer can be transferred by sandwiching a resin between a mold and a substrate. A thermal nanoimprint method, a photonanoimprint method, and the like have been studied depending on an employed material. Of the above methods, the photonanoimprint method includes four steps of: i) application of a resin layer; ii) pressing by use of the mold; iii) photo-curing; and iv) mold-releasing. The photonanoimprint method is excellent in that processing on a nanoscale can be achieved by the simple process as described above. Especially, since a photo-curable resin curable by being irradiated with light is used as the resin layer, a period of time for a pattern transfer step is short and a high throughput is promised. Thus, the photo-nanoimprint method is expected to come into practical use in many fields including, for example, an optical member such as the organic EL element and LED, MEMS, a biochip and the like, in addition to a semiconductor device.

However, the photo-curable resin described above generally has a low heat resistance, and decomposed and/or turns into yellow at a high temperature. Thus, there is fear that a film having the minute pattern is decomposed in a case that a high temperature treatment is included in subsequent steps. Further, the photo-curable resin has a low adhesion property to a glass substrate. Furthermore, in a case that the resin layer to which the pattern has been transferred is used for an element such as the organic EL element, there is fear that impurities are eluted from the resin layer and cause adverse effect on the element.

As the thermal nanoimprint method, for example, there has been known the method as described in Japanese Patent Application Laid-open No. 2001-26052. That is, it is prepared a mold having a planar transfer surface on which a concavity and convexity pattern is formed; a thermoplastic base member (processed object) is heated and softened; the transfer surface is pressured and pressed against the base member; the mold and the base member are cooled as they are; the mold is peeled off from the base member; and thereby an inverted pattern is transferred. The thermal nanoimprint method has advantages such that the nano-level transfer can be achieved by the simple method as described above, and that there is a wide range of choice of the transfer-target base member.

However, the thermal nanoimprint method generally needs a high pressure for pressing, and takes time for a heating-cooling cycle. Thus, the thermal nanoimprint method is unsuitable for a case in which high productivity is desired. Further, the thermal nanoimprint method has the problem of the heat resistance since the thermoplastic resin is heated and softened to perform the transfer. For example, in a case that the transfer-target object is exposed to a temperature higher than a molding temperature, there is a fear that the pattern is deformed and thereby it can not be used.

A method for improving the heat resistance is exemplified by a nanoimprint method using a thermosetting material. For example, there has been known the method as described in Japanese Patent Application Laid-open No. 2008-049544. That is, a resist film is applied on a substrate, the substrate is pressed with a mold having a flat plate shape, and then the resist film is cured using a heater. Especially, a nanoimprint molded product using an inorganic sol-gel material has a high heat resistance, and any problem is unlikely to occur even when a high temperature treatment is performed. However, the pressing method using the sol-gel material also has the following problem. Each thermal expansion coefficient of the flat-plate-shaped mold, the base member, and a stage is different from one another, thus the difference in the linear coefficients of expansion causes deviation in a transferred surface profile of the molded product. In order to suppress the deviation, a means for absorbing the thermal expansion and/or a long period of heating-cooling process is/are required. Further, since a solvent positioned in the center of the mold having the flat plate shape used for the pressing is less likely to evaporate, transfer failure occurs in the center of the mold and/or unevenness of the transfer occurs owing to the difference in a cured state of the surface. Furthermore, in a case that gas is generated due to bumping of the solvent, bubbles are formed in the pattern and/or a trace or mark of gas (a trace of escape of gas) is left in some cases. The above problems become especially conspicuous when the transfer pattern is formed in a large area. The solvent evaporates from an end portion of the coating film, and a heating process is required for a long time at a low temperature (for example, 120 degrees Celsius) in order to evaporate the solvent completely, which decreases the productivity. Further, since the surface of the mold having the flat plate shape needs to be pressed uniformly at the same time, a relatively great transfer pressure is required. Thus, when the transfer pattern has the large area, it is difficult to press the surface of the mold uniformly under the great pressure. Moreover, when the mold is peeled off from the base member, a great peeling force is required to pull up the mold in a vertical direction. Therefore, there is fear that a sol-gel material layer is broken at the time of the peeling of the mold from the sol-gel material layer, and thereby the pattern is collapsed. As described above, there are many problems to perform the press transfer to a large area by use of the mold having the flat plate shape.

Instead of the pressing method using the flat-plat-shaped mold, there has been known the roll press method, as described in Japanese Patent Application Laid-open No. 2010-269480, in which a pressing roll and a cylindrical master plate for duplication having a minute concavity and convexity pattern are used. An area of contact between a mold and a coating film is small in a roll process as compared with the case in which the flat-plate-shaped mold is used, and thus it is considered that some of the above problems can be solved. However, the roll press method using the sol-gel material also has the following problem. In processing using the sol-gel material, the processing is started from a raw material solution; after production of sol, gel is produced by chemical reaction such as hydrolysis and condensation polymerization; the solvent remained inside is removed by a heating process; and the glass and ceramics is obtained by further promoting densification. However, since the time-dependent change of evaporation of the solvent in a gelled state is rapid, if the control is not performed precisely after the sol is applied on the substrate and before the concavity and convexity pattern is pressed by the roll press, the failure arises such that depths of concavities and convexities are insufficient and that the transfer pattern can not be obtained.

In view of the above, an object of the present invention is to provide a method for reliably producing a substrate having a minute or fine concavity and convexity pattern by use of a sol-gel material by a roll press method with high efficiency. Another object of the present invention is to provide an organic EL element having excellent durability and satisfactory light resistance. Still another object of the present invention is to provide a sol suitable for the method for producing the substrate of the present invention.

SUMMARY OF THE INVENTION

According to the first aspect of the present invention, there is provided a method for producing a substrate having a concavity and convexity pattern, including:

a step of applying a sol, which contains a silica precursor, on a substrate to form a coating film;

a step of drying the coating film;

a step of pressing a mold having a concavity and convexity pattern against the dried coating film with a pressing roll so that the concavity and convexity pattern is pressed onto the coating film;

a step of peeling off the mold from the coating film; and a step of baking the coating film to which the concavity and convexity pattern has been transferred, wherein the coating film is dried in the drying step so that a ratio of weight of the coating film to dried weight of the coating film is in a range of 1.4 to 8.8, the dried weight being obtained by baking the coating film at a temperature of 100 degrees Celsius.

In the step of pressing the concavity and convexity pattern against the coating film in the method of the present invention, the mold having the concavity and convexity pattern may be pressed against the dried coating film with the pressing roll while the dried coating film is heated. In a case that the dried coating film is heated, the coating film may be dried in the drying step so that the ratio of the weight of the coating film to the dried weight of the coating film is in a range of 1.4 to 4.5, the dried weight being obtained by baking the coating film at a temperature of 100 degrees Celsius. In the case that the dried coating film is heated, the pressing roll may include a heater. In this case, the pressing roll may be heated to temperatures of 40 degrees Celsius to 150 degrees Celsius by the heater.

In the method of the present invention, the sol preferably contains one kind of metal alkoxide or a several kinds of metal alkoxides. Further, the sol preferably contains a mixture of tetraethoxysilane (TEOS) and methyltriethoxysilane (MTES).

The method of the present invention preferably includes a pre-baking step, in which the coating film to which the concavity and convexity pattern has been pressed is subjected to pre-baking before the mold is peeled off, so that the mold is easily peeled off from the coating film on the side of the substrate.

In the peeling step, a peeling roll is preferably used to peel off the mold from the coating film easily. Especially, the peeling roll is heated to peel off the mold from the coating film more easily.

The average pitch of concavities and convexities on the concavity and convexity pattern may be in a range of 100 nm to 900 nm and especially in a range of 100 nm to 600 nm. The average height of the concavities and convexities may be in a range of 20 nm to 200 nm. The mold having the concavity and convexity pattern may be a flexible mold. In a case that the flexible mold is used, the flexible mold may be a long mold having a length longer than that of the substrate from a viewpoint of improving the productivity. The long mold can be pressed against the coating film with the pressing roll while being transported by use of a feeding roll which feeds the long mold and a winding roll which winds or rolls up the long mold thereon.

According to the second aspect of the present invention, there is provided a method for producing an organic EL element, wherein a diffraction-grating substrate having a concavity and convexity surface is manufactured by the method for producing the substrate having the concavity and convexity pattern as defined in the first aspect; and a transparent electrode, an organic layer, and a metal electrode are stacked in this order on the concavity and convexity surface of the diffraction-grating substrate, thereby producing the organic EL element.

According to the third aspect of the present invention, there is provided an organic EL element which is obtained by the method as defined in the second aspect to include a transparent electrode, an organic layer, and a metal electrode on a diffraction-grating substrate having a concavity and convexity surface, wherein the diffraction-grating substrate is formed of a substrate having no concavity and convexity pattern and a silica layer having a concavity and convexity pattern formed directly on the substrate having no concavity and convexity pattern. In this case, the substrate may be a substrate made of an inorganic material.

According to the fourth aspect of the present invention, there is provided a sol (sol-gel solution) used for the method for producing the substrate having the concavity and convexity pattern as defined in the first aspect.

According to the present invention, by drying the coating film so that the ratio of weight of the coating film to the dried weight of the coating film is in a range of 1.4 to 8.8, the dried weight being obtained by baking the coating film having a relatively large area at a temperature of 100 degrees Celsius, it is possible to reliably transfer the concavity and convexity pattern from the mold to the coating film by use of the pressing roll in a short time after the drying step. Therefore, it is possible to produce a substrate, which has a relatively large area, with a coating film, which has a minute concavity and convexity pattern, at a high yield. Further, the yield can be further improved by performing the pressing step while heating the coating film. Since the concavity and convexity pattern of the substrate is made of silica by the sol-gel process, the substrate obtained by the method of the present invention is a substrate which may be resistant to a high temperature process performed when the organic EL element is produced. The organic EL element produced by the present invention has excellent durability and satisfactory light resistance.

BRIEF DESCRIPTION OF THE DRAWINGS

FIGS. 14A-14C schematically show a structure of a mold used in Examples, wherein FIG. 14A is a plan view of the mold, FIG. 14B shows a planer structure of one pattern partitioned or divided into three, and FIG. 14C is a cross-sectional view of a partitioned 400 nm pitch pattern.

DESCRIPTION OF THE PREFERRED EMBODIMENTS

Hereinbelow, an embodiment of a method for forming a substrate having a concavity and convexity pattern of the present invention will be described with reference to the drawings.

Figure 1:
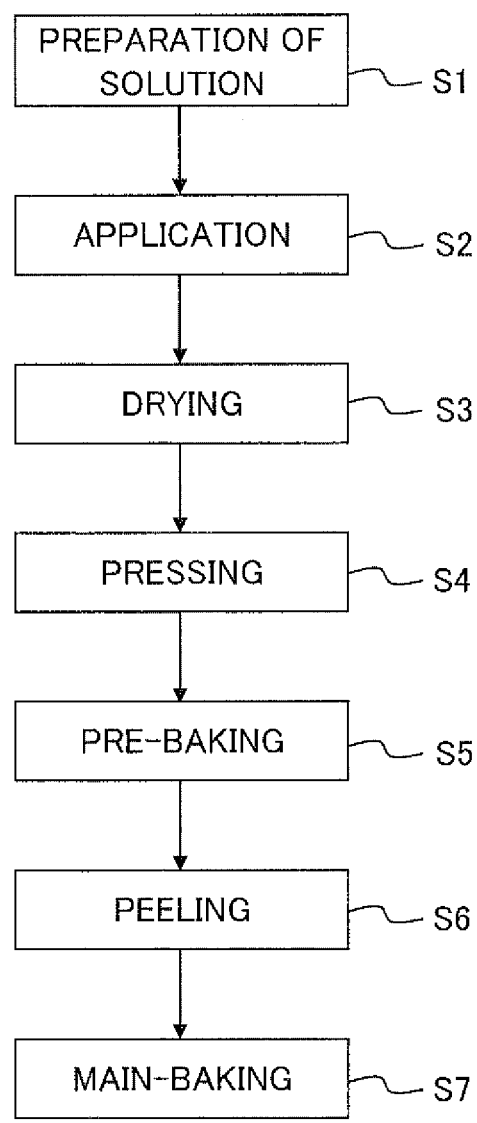
FIG. 1 is a flowchart showing a method for producing a substrate having a concavity and convexity pattern of the present invention.

As shown in FIG. 1, the method for forming the substrate having the concavity and convexity pattern of the present invention mainly includes: a solution preparation step S1 for preparing a sol (also referred to as a sol-gel solution); an application step S2 for applying the prepared sol on a substrate; a drying step S3 for drying the coating film of the sol applied on the substrate; a pressing step S4 for pressing a mold having a transfer pattern; a pre-baking step S5 during which the coating film to which the mold has been pressed is subjected to pre-baking; a peeling step S6 for peeling off the mold from the coating film; and a main baking step S7 during which the coating film is subjected to main baking. Hereinbelow, an explanation will be made about each of the steps sequentially.

[Sol Preparation Step]

In the present invention, at first, a sol is prepared to form a coating film to which a pattern is transferred by a sol-gel method. For example, in a case that silica is synthesized on a substrate by the sol-gel method, a sol of metal alkoxide (silica precursor) is prepared. The silica precursor is exemplified by metal alkoxides including, for example, tetraalkoxide monomers such as tetramethoxysilane (TMOS), tetraethoxysilane (TEOS), tetra-i-propoxysilane, tetra-n-propoxysilane, tetra-i-butoxysilane, tetra-n-butoxysilane, tetra-sec-butoxysilane, and tetra-t-butoxysilane; trialkoxide monomers such as methyl trimethoxysilane, ethyl trimethoxysilane, propyl trimethoxysilane, isopropyl trimethoxysilane, phenyl trimethoxysilane, methyl triethoxysilane (MTES), ethyl triethoxysilane, propyl triethoxysilane, isopropyl triethoxysilane, phenyl triethoxysilane, methyl tripropoxysilane, ethyl tripropoxysilane, propyl tripropoxysilane, isopropyl tripropoxysilane, phenyl tripropoxysilane, methyl triisopropoxysilane, ethyl triisopropoxysilane, propyl triisopropoxysilane, isopropyl triisopropoxysilane, phenyl triisopropoxysilane; a polymer obtained by polymerizing the above monomers in small amounts; and a composite material characterized in that functional group and/or polymer is/are introduced into a part of the above material. Further, the silica precursor is exemplified, for example, by metal acetylacetonate, metal carboxylate, oxychloride, chloride, and mixtures thereof. The silica precursor, however, is not limited thereto. Examples of metal species include, in addition to Si, Ti, Sn, Al, Zn, Zr, In, and mixtures thereof, but are not limited thereto. It is also possible to use any appropriate mixture of precursors of the oxides of the above metals.

In a case that a mixture of TEOS and MTES is used, the mixture ratio thereof can be 1:1, for example, in a molar ratio. The sol produces amorphous silica by performing hydrolysis and polycondensation reaction. An acid such as hydrochloric acid or an alkali such as ammonia is added in order to adjust pH of the sol as a synthesis condition. The pH is preferably not more than 4 or not less than 10. Water may be added to perform the hydrolysis. The amount of water to be added can be 1.5 times or more with respect to metal alkoxide species in the molar ratio.

Examples of the solvent include alcohols such as methanol, ethanol, isopropyl alcohol (IPA), and butanol; aliphatic hydrocarbons such as hexane, heptane, octane, decane, and cyclohexane; aromatic hydrocarbons such as benzene, toluene, xylene, and mesitylene; ethers such as diethyl ether, tetrahydrofuran, and dioxane; ketones such as acetone, methyl ethyl ketone, isophorone, and cyclohexanone; ether alcohols such as butoxyethyl ether, hexyloxyethyl alcohol, methoxy-2-propanol, and benzyloxyethanol; glycols such as ethylene glycol and propylene glycol; glycol ethers such as ethylene glycol dimethyl ether, diethylene glycol dimethyl ether, and propylene glycol monomethyl ether acetate; esters such as ethyl acetate, ethyl lactate, and γ-butyrolactone; phenols such as phenol and chlorophenol; amides such as N,N-dimethylformamide, N,N-dimethylacetamide, and N-methylpyrrolidone; halogen-containing solvents such as chloroform, methylene chloride, tetrachloroethane, monochlorobenzene, and dichlorobenzene; hetero-element containing compounds such as carbon disulfide; water; and mixture solvents thereof. Especially, ethanol and isopropyl alcohol are preferable. Further, a mixture of water and ethanol and a mixture of water and isopropyl alcohol are also preferable.

As an additive, it is possible to use any additive such as polyethylene glycol, polyethylene oxide, hydroxypropylcellulose, and polyvinyl alcohol for viscosity adjustment; alkanolamine such as triethanolamine as a solution stabilizer; β-diketone such as acetylacetone; β-ketoester; formamid; dimethylformamide; and dioxane.

Further, any of the following surfactants may be contained as the additive. The surfactants include, for example, a hydrocarbon surfactant, a fluorine surfactant, and a silicone surfactant. The hydrocarbon surfactant is exemplified, for example, by alkylbenzene sulfonates, higher alcohol sulfuric acid ester salts, polyoxyethylene alkyl ether sulfates, α-sulfo aliphatic acid esters, α-olefin sulfonates, monoalkyl phosphoric acid ester salts, alkane sulfonates, alkyl trimethylammonium salts, dialkyl dimethylammonium salts, alkyl dimethyl benzylammonium salts, amine salts, alkylamino fatty acid salts, alkylamineoxides, polyoxyethylene alkylethers, polyoxyethylene alkylphenol ethers, alkyl glucosides, and polyoxyethylene aliphatic acid esters.

[Application Step]

The sol prepared as described above is applied on the substrate. As the substrate, substrates made of inorganic materials such as glass, silica glass, and silicon substrates or substrates of resins such as polyethylene terephthalate (PET), polyethylene naphthalate (PEN), polycarbonate (PC), cycloolefin polymer (COP), polymethyl methacrylate (PMMA), polystyrene (PS), polyimide (PI), and polyarylate may be used. The substrate may be transparent or opaque. In a case that a substrate having a concavity and convexity pattern, which is obtained by using this substrate, is used for production of the organic EL element as will be described later, the substrate desirably has the resistance to heat, ultraviolet (UV) light, etc. In view of this, the substrates made of the inorganic materials such as the glass, the silica glass, and the silicon substrates are more preferable. A surface treatment may be performed or an easy-adhesion layer may be provided on the substrate to improve the adhesion property. And a gas barrier layer may be provided in order to keep out moisture and/or gas such as oxygen. As a method for applying the sol, it is possible to use any application method (coating method) such as a bar coating method, a spin coating method, a spray coating method, a dip coating method, a die coating method, and an ink-jet method. Among the methods as described above, the bar coating method, the die coating method, and the spin coating method are preferable, because the sol can be uniformly applied on the substrate having a relatively large area and the application can be quickly completed prior to gelation of the sol. It is noted that, since a desired concavity and convexity pattern of a sol-gel material layer is formed in subsequent steps, a surface of the substrate (including the surface treatment or the easy-adhesion layer in case that the surface treatment or the easy-adhesion layer is present) may be flat, and the substrate itself does not have the desired concavity and convexity pattern.

[Drying Step]

After the application step, the substrate is held or kept in the atmosphere or under reduced pressure to evaporate the solvent in the applied coating film (hereinafter also referred to as "sol-gel material layer" as appropriate). In a case that the holding time of the substrate is short, the viscosity of the coating film is too low to perform the transfer in the subsequent transfer step. In a case that the holding time of the substrate is too long, the polymerization reaction of the precursor proceeds too much and thereby the transfer cannot be performed in the transfer step. A holding temperature desirably stays constant in a range of 10 to 100 degrees Celsius, and more desirably stays constant in a range of 10 to 30 degrees Celsius. In a case that the holding temperature is higher than this range, the gelation reaction of the coating film proceeds rapidly before the pressing step, which is not preferable. In a case that the holding temperature is lower than this range, the gelation reaction of the coating film proceeds slowly before the pressing step, which reduces the productivity and is not preferable. Accordingly, since the drying state changes depending on the holding temperature and the holding time, holding conditions in the drying step are required to be controlled accurately. After the application of the sol, the polymerization reaction of the precursor proceeds as the evaporation of the solvent evaporates, and the physical property such as the viscosity of the sol also changes in a short time. The amount of vaporization of the solvent depends also on the amount of the solvent (concentration of the sol) used at the time of preparing the sol. Therefore, a criterion for evaluating a state suitable for the transfer is desired.

Inventors of the present invention controlled the drying step to optimize the pressing by use of the mold in the subsequent transfer step from the following viewpoints. In a case of the hydrolysis/condensation polymerization reaction of the silica precursor, dealcoholization reaction generally occurs to generate alcohol in the sol. A volatile solvent such as the alcohol is used in the sol as the solvent. That is, the alcohol generated in the hydrolysis process and the alcohol existing as the solvent are included in the sol, and sol-gel reaction proceeds by removing them in the drying process. The investigation of an elapsed time and an evaporation amount at the time of evaporating the solvent from the coating film after applying the sol on the glass substrate by use of the bar coater showed that the result shown in FIG. 2. That is, the evaporation of the solvent starts rapidly immediately after the application, the evaporation amount decreases exponentially, and the evaporation amount hardly changes after a predetermined time. It is considered that there is little alcohol solvent remained in the coating film when the change in weight of the coating film ends. Therefore, a residual alcohol amount in the coating film can be calculated by measuring the weight of the coating film in this situation. As a result, the progress of the sol-gel reaction can be quantified. By finding a weight change b(t)/a which enables the transfer, assuming that the weight of the coating film obtained when the change in weight of the coating film ends is "a" and the weight of the coating film obtained when "t" hour(s) has(have) elapsed after the application is "b(t)", the weight change b(t)/a can be used as the criterion in the drying step. According to Examples which will be described later, in a case that a mixture of TEOS and MTES is used as the precursor, $b(t)/a$ is preferably in a range of $1.4 \leq b(t)/a \leq 8.8$ to transfer the pattern. In a case that $b(t)/a$ is less than 1.4, the coating film is so hard that the pattern can not be transferred. In a case that $b(t)/a$ exceeds 8.8, the evaporation of the solvent is insufficient and the coating film is so soft that there is fear that the coating film is damaged at the time of peeling off the mold or the pattern can not be transferred at all in a case that a period of time during which the mold makes contact with the coating film is short as in the case of the subsequent transfer step. Especially, in a case that the coating film is pressed while being heated in the pressing step as will be described later, the coating film is cured in a short time including the drying step and a period of time during which the coating film passes through the pressing roll. Therefore, the solvent is required to evaporate sufficiently in the drying step, and thus $b(t)/a$ is more preferably $1.4 \leq b(t)/a \leq 4.5$. In a case that the coating film is too soft owing to the inadequate evaporation of the solvent included in the coating film, and further that $b(t)/a$ exceeds 4.0, the following situation may be caused. That is, since the fluidity of the coating film is high, the liquid is more likely to flow outside of a transfer section with pressure at the time of the pattern transfer, which may contaminate a manufacturing line. Therefore, $b(t)/a$ is further more preferably $1.4 \leq b(t)/a \leq 4.0$.

The weight change $b(t)/a$ of the coating film is recorded in advance by finding the weight change of the sol at each elapsed time after the application in a preliminary experiment. Then, a value included in the above range is selected as the weight change $b(t)/a$ of the sol, and an elapsed time "t" corresponding to the selected value can be set as the holding time in the drying step.

[Pressing Step]

After the elapsed time set as described above, the mold in which a predetermined minute concavity and convexity pattern is formed is pressed against the coating film with the pressing roll. A roll process using the pressing roll has the following advantages as compared with a pressing system: i) the period of time during which the mold and the coating film are brought in contact with each other in the roll process is shorter than that in the pressing system, and thus it is possible to prevent deformation of the pattern caused by difference among coefficients of thermal expansion of the mold, the substrate, a stage on which the substrate is provided, and the like; ii) productivity is improved by the roll process and the productivity is further improved by use of a long mold; iii) it is possible to prevent generation of bubbles of gas in the pattern caused by bumping of the solvent in the gel solution and/or it is possible to prevent a trace or mark of gas from being left; iv) it is possible to reduce transfer pressure and peeling force because of line contact with the substrate (coating film), and thereby making it possible to deal with a larger substrate readily; and v) no bubble is involved during the pressing.

It is possible to use arbitrary pressing roll (transfer roll), and the pressing roll preferably includes a surface having a film coated with a resin material such as ethylene propylene diene rubber (EPDM), silicone rubber, nitrile rubber, fluororubber, acrylic rubber, and chloroprene rubber. A support roll may be provided to face the pressing roll while sandwiching the substrate therebetween in order to resist pressure applied by the pressing roll. Alternatively, a support base supporting the substrate may be provided.

When the mold is pressed with the pressing roll, while the surface of the coating film on the substrate is covered with the mold, the pressing roll can be moved and rotated relative to the surface of the coating film. Alternatively, it is allowable to use, as the press roll, a roll having the mold previously wound on the outer circumference thereof. When the pressing is performed, a roll temperature can be maintained at 10 to 150 degrees Celsius.

When the mold is pressed against the coating film by use of the pressing roll, the mold may be pressed against the coating film while the coating film is heated (referred to as "hot press" as appropriate). By pressing the mold against the coating film while heating the coating film, gas generated by the heating can escape to the outside of the system from the side (or portion) at which the mold engages with the coating film by the pressing roll, without remaining between the coating film and the mold (film mold), and thereby obtaining an effect that a void is unlikely to be formed. Further, the hot press can shorten a period of time elapsed between the pressing of the mold and the peeling of the mold, and can perform the pre-baking step which will be described later in the pressing step (that is, the pre-baking step may be omitted). As a method for heating the coating film, for example, the heating may be performed through the pressing roll, or the coating film may be heated directly or from the side of the substrate. In a case that the heating is performed through the pressing roll, a heating means may be provided in the pressing roll (transfer roll), and any heating means can be used. Although it is preferable that a heater is included in the pressing roll, it is allowable that the heater is provided separately from the pressing roll. In any case, arbitrary pressing roll may be used provided that the coating film can be pressed while being heated.

The heating temperature of the coating film at the time of the hot press may be in a range of 40 degrees Celsius to 150 degrees Celsius. Similarly, in a case that the heating is performed by use of the pressing roll, the heating temperature of the pressing roll may be in a range of 40 degrees Celsius to 150 degrees Celsius. By heating the pressing roll as described above, the mold can be easily peeled off from the coating film against which the mold has been pressed, and thereby making it possible to improve the productivity. In a case that the heating temperature of the coating film or the pressing roll is less than 40 degrees Celsius, the mold can not be expected to be peeled off from the coating film quickly. In a case that the heating temperature of the coating film or the pressing roll exceeds 150 degrees Celsius, the solvent used evaporates so rapidly that there is fear that the concavity and convexity pattern is not transferred sufficiently. The support roll (as will be described later) provided on the lower side of the pressing roll may also be heated, for example, to temperatures of 40 degrees Celsius to 150 degrees Celsius. As a means for heating the coating film, not only the heating of the pressing roll but also various specific embodiments which will be described later can be adopted.

[Mold Used in Pressing Step and Production Method Thereof]

The mold used in the present invention means the flexible mold such as a film-shaped mold. The mold is made, for example, of organic materials such as silicon resin, polyethylene terephthalate (PET), polyethylene naphthalate (PEN), polycarbonate (PC), cycloolefin polymer (COP), polymethyl methacrylate (PMMA), polystyrene (PS), polyimide (PI), and polyarylate; metallic materials such as nickel, copper, and aluminium; and inorganic materials such as glass. The material of the mold is not limited, and the mold formed of arbitrary material can be used. The concavity and convexity pattern may be formed directly to each of the materials or may be formed of another material by using each of the materials as a base material. It is possible to use photo-curable resin, thermosetting resin, and thermoplastic resin as another material. A surface treatment or an easy-adhesion treatment may be performed between the base material and another material in order to improve the adhesion property. Further, a mold-release treatment may be performed on each concavity and convexity pattern surface as needed. The pattern formed on the mold may be formed to have any profile by arbitrary method. In a case that the hot press is performed, it may be used a mold made of a material which can resist the heating temperature.

In a case that the mold is used for a diffraction-grating substrate for organic EL, it is preferable to use a method of utilizing self-organization or assembly (micro phase separation) of a block copolymer described in Japanese Patent Application Laid-open No. 2011-006487 of the inventors of the present invention (hereinafter referred to as "BCP (Block Copolymer) method" as appropriate) or a method of heating and cooling a polymer film on a vapor-deposited film to form concavities and convexities of wrinkles on a surface of polymer disclosed in PCT International Publication No. WO2011/007878A1 of the inventors of the present invention (hereinafter referred to as "BKL (Buckling) method" as appropriate). A photolithography method may be utilized instead of the BCP and BKL methods. In a case that the pattern is formed by the BCP method, the pattern can be made of any material, and the material is preferably a block copolymer composed of combinations of two selected from the group consisting of a styrene-based polymer such as polystyren; polyalkyl methacrylate such as polymethyl methacrylate; polyethylene oxide; polybutadiene; polyisoprene; polyvinylpyridine; and polylactic acid.

Pitches and heights of concavities and convexities of the minute pattern of the mold are arbitrary. For example, in a case that the transfer pattern is used for scattering or diffracting light in a visible region, the average pitch of the concavities and convexities is preferably in a range of 100 nm to 900 nm, particularly preferably in a range of 100 nm to 600 nm or 200 nm to 900 nm, and more preferably in a range of 200 nm to 600 nm. In a case that the average pitch of the concavities and convexities is less than the lower limit, the pitches are so small relative to wavelengths of the visible light that the diffraction of the light by the concavities and convexities is less likely to occur. In a case that the average pitch exceeds the upper limit, a diffraction angle is so small that functions as an optical element such as the diffraction grating are more likely to be lost. The average height of the concavities and convexities is preferably in a range of 20 nm to 200 nm, and more preferably in a range of 50 nm to 150 nm. In a case that the average height of the concavities and convexities is less than the lower limit, the height is so short relative to the wavelengths of the visible light that the required diffraction is less likely to occur. In a case that the average height exceeds the upper limit, the following tendency is found. That is, when the transfer pattern being used as the optical element for light extraction of the organic EL element, the electric field distribution in an EL layer becomes non-uniform, and electric fields concentrate on a certain position or area, thereby a leak current is more likely to arise or the service life thereof tends to be shortened.

After forming the master block with the pattern by the BCP or BKL method, a mold to which the pattern is transferred can be formed by an electroforming method or the like as follows. At first, a seed layer functioning as an electroconductive layer for an electroforming process can be formed on the master block having the pattern by non-electrolytic plating, sputtering, vapor deposition, or the like. The thickness of the seed layer is preferably not less than 10 nm to uniformize a current density during the subsequent electroforming process, and thereby making the thickness of a metal layer accumulated by the subsequent electroforming process to be constant. As the material of the seed layer, it is possible to use, for example, nickel, copper, gold, silver, platinum, titanium, cobalt, tin, zinc, chrome, gold-cobalt alloy, gold-nickel alloy, boron-nickel alloy, solder, copper-nickel-chromium alloy, tin-nickel alloy, nickel-palladium alloy, nickel-cobalt-phosphorus alloy, or alloy thereof. Subsequently, a metal layer is accumulated on the seed layer by the electroforming (electroplating). The entire thickness of the metal layer including the thickness of the seed layer can be, for example, in a range of 10 to 3000 μm. As the material of the metal layer accumulated by the electroforming, it is possible to use any of metal species as described above which can be used as the seed layer. It is preferable to use nickel as the material of the metal layer in view of the wear resistance, the peeling property, and the like of a metal substrate to be obtained as the mold. In this case, nickel is also preferably used for the seed layer. Considering ease of the subsequent processes for forming the mold such as pressing to the resin layer, peeling, and cleaning, the formed metal layer desirably has appropriate hardness and thickness.

The metal layer including the seed layer obtained as described above is peeled off from the master block having the concave and convex structure to obtain a metal substrate. As a peeling method, the metal layer may be peeled off physically, or the materials composing the pattern may be dissolved to be removed by using an organic solvent dissolving them, such as toluene, tetrahydrofuran (THF), and chloroform. In a case that the metal substrate is peeled off from the master block, a remaining material component on the metal substrate can be removed by cleaning. As a cleaning method, it is possible to use a wet cleaning using the surfactant etc., or a dry cleaning using ultraviolet rays and/or plasma. Alternatively, for example, the remaining material component may be attached to an adhesive agent or a bonding agent then be removed. Accordingly, the metal substrate to which the pattern has been transferred from the master block can be obtained.

By using the obtained metal substrate, the flexible mold such as the film-shaped mold can be produced by transferring the concave and convex structure (pattern) of the metal substrate to a film-shaped support substrate. For example, after curable resin is applied on the support substrate, the resin layer is cured while the concave and convex structure of the metal substrate is pressed against the resin layer. The support substrate is exemplified, for example, by base members made of inorganic materials such as glass; base members made of organic materials such as silicon resin, polyethylene terephthalate (PET), polyethylene naphthalate (PEN), polycarbonate (PC), cycloolefin polymer (COP), polymethyl methacrylate (PMMA), polystyrene (PS), polyimide (PI), and polyarylate; and metallic materials such as nickel, copper, and aluminium. The thickness of the support substrate may be in a range of 1 to 500 μm.

The curable resin is exemplified by various types of resin such as epoxy resin, acrylic resin, methacrylic resin, vinyl ether resin, oxetane resin, urethane resin, melamine resin, urea resin, polyester resin, phenol resin, cross-linking type liquid crystal resin, fluorine resin, and silicon resin. The thickness of the cured resin is preferably in a range of 0.5 to 500 μm. In a case that the thickness is less than the lower limit, heights of the concavities and convexities formed on the surface of the cured resin layer are likely to be insufficient. In a case that the thickness exceeds the upper limit, the influence of volume change of the resin upon curing is likely to be so large that the formation of the shape of the concavities and convexities tends to be unsatisfactory.

As a method for applying the curable resin, it is possible to adopt various coating methods such as a spin coating method, a spray coating method, a dip coating method, a dropping method, a gravure printing method, a screen printing method, a relief printing method, a die coating method, a curtain coating method, an ink-jet method, and a sputtering method. The conditions for curing the curable resin vary with the kind of the resin used. For example, a curing temperature is preferably in a range of room temperature to 250 degrees Celsius, and a curing time is preferably in a range of 0.5 minutes to 3 hours. Alternatively, it is allowable to use a method in which the curable resin is cured by irradiation with energy rays such as ultraviolet rays or electron beams. In such a case, the amount of the irradiation is preferably in a range of $20\,mJ/cm^2$ to $5\,J/cm^2$.

Subsequently, the metal substrate is detached from the cured resin layer in a cured state. A method for detaching the metal substrate is not limited to a mechanical peeling method, and any known method can be adopted. Then, it is possible to obtain a mold, which is formed of a resin film and which has the cured resin layer, on which the concavities and convexities is formed, on the support substrate.

Figure 3:
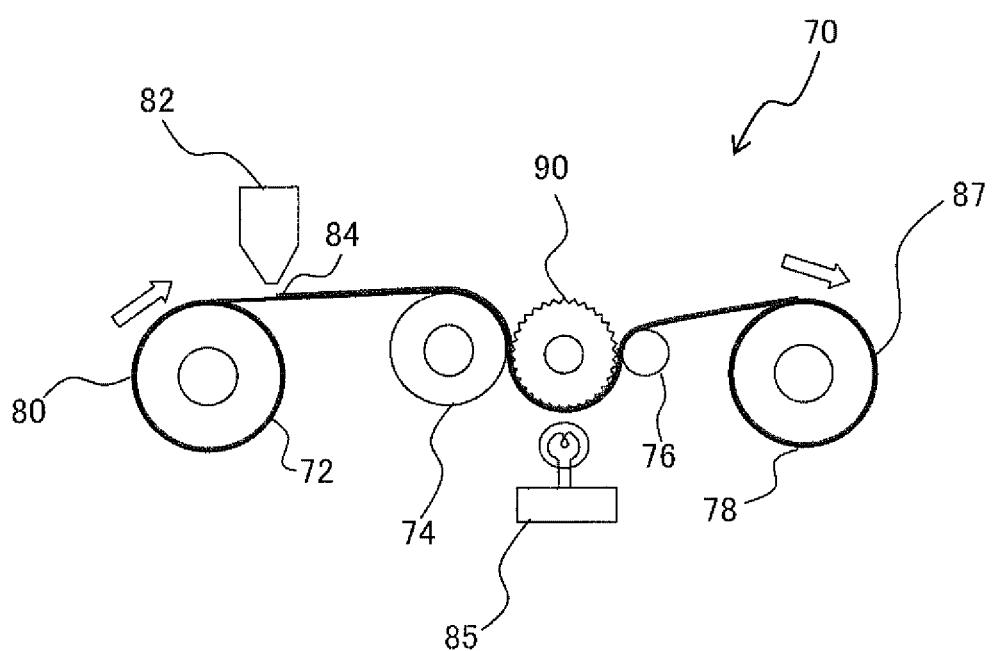
FIG. 3 is a conceptual view illustrating an apparatus for producing a flexible mold by a roll process.

FIG. 3 shows an example of a roll process for manufacturing the flexible mold such as the film-shaped mold by use of the metal substrate. A roll process apparatus 70 shown in FIG. 3 mainly includes a transport system of a substrate film 80 such as PET, a die coater 82 for applying UV curable resin on the substrate film 80 during transportation, a metal roll (metal mold) 90 which is positioned on the downstream side of the die coater 82 and transfers a pattern, and a radiation light source 85 which is provided to face the metal roll 90 with the substrate film 80 intervening therebetween and emits UV light to the substrate film 80. The metal roll 90 may be a metal roll having the pattern directly formed thereon, a metal roll in which the metal substrate is wound on the roll and then fixed, or a metal roll formed by manufacturing a cylindrical metal substrate and fitting and fixing the substrate into the roll. The transport system includes a film feeding roll 72 which feeds the substrate film 80, a nip roll 74 and a peeling roll 76 which are arranged on the upstream and downstream sides of the metal roll 90 respectively and urge the substrate film toward the metal roll 90, and a winding roll 78 which winds or rolls up the substrate film 87 having the pattern transferred thereon. The substrate film 80 wound on the film feeding roll 72 is fed to the downstream side by rotation of the film feeding roll 72, then a UV curable resin 84 is applied on the upper surface of the substrate film 80 by the die coater 82 to have a predetermined thickness. The metal roll 90 is pressed against the UV curable resin 84 on the substrate film 80 by the nip roll(s) 74, so that the concavity and convexity pattern of the metal roll 90 is transferred to the UV curable resin 84, and at the same time or immediately after the above, the UV light is emitted from the radiation light source 85 and the UV curable resin 84 cures. After peeling off a substrate film 87 with the UV curable resin having the cured pattern from the metal roll 90 by use of the peeling roll 76, the substrate film 87 is wound around the winding roll 78. Accordingly, a long and flexible mold is obtained. Such a long mold is suitable for the transfer process (nanoimprint) using the pressing roll of the present invention.

[Pre-Baking Step]

Figure 4:
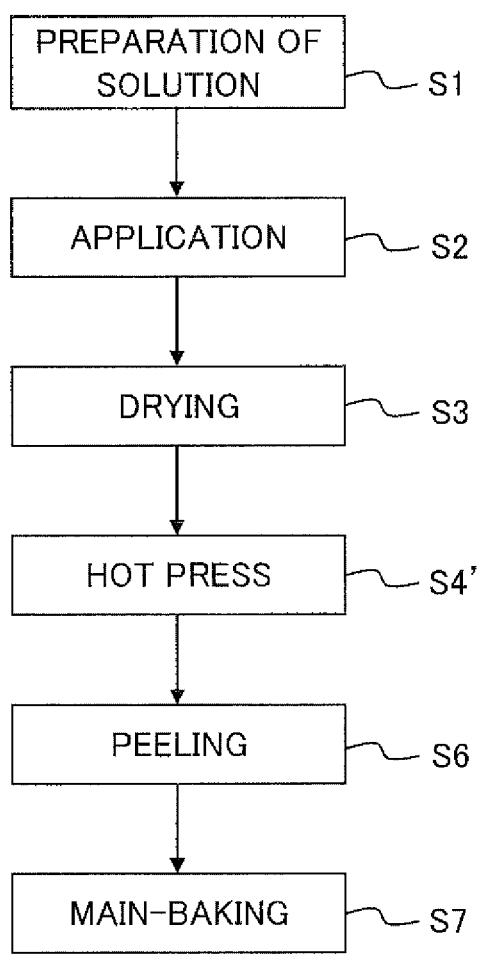
FIG. 4 is a flowchart showing a method for producing a substrate having a concavity and convexity pattern by hot press.

After the mold is pressed against the coating film (sol-gel material layer), the coating film may be subjected to the pre-baking. The pre-baking promotes gelation of the coating film to solidify the pattern, and thereby the pattern is less likely to be collapsed during the peeling. In a case that the pre-baking is performed, the heating is preferably performed at temperatures of 40 degrees Celsius to 150 degrees Celsius in the atmosphere. It is not indispensable to perform the pre-baking. FIG. 4 shows a process in which the hot press is performed in the pressing step.

[Peeling Step]

The mold is peeled off from the coating film (sol-gel material layer) after the pressing step or the pre-baking step. Since the roll is used as described above, the peeling force may be smaller than that in the case of using a plate-shaped mold, and it is possible to easily peel off the mold from the coating film without remaining the coating film on the mold. In order to promote the mold peeing, it is possible to use a peeling roll as will be described later (see FIG. 5). By providing the peeling roll on the downstream side of the pressing roll and rotating and supporting the mold while urging the mold toward the coating film, a state in which the mold is attached to the coating film can be maintained for a certain period of time, and the coating film can be subjected to the pre-baking during the certain period of time. In a case that the peeling roll is used, a portion where the mold is peeled subsequently moves to make the peeling force small. Thus, as compared with a case in which the mold is peeled off at once, the pattern is less likely to be collapsed. In a case that the mold is peeled off while heating the peeling roll, for example, at temperatures of 40 degrees Celsius to 150 degrees Celsius, it is possible to peel off the mold from the coating film more easily.

[Main Baking Step]

After the mold is peeled off from a coating film (sol-gel material layer) 42 on a substrate 40, the coating film is subjected to the main baking (main sintering or main calcinating). Hydroxyl group and the like contained in silica (amorphous silica) forming the coating film is desorbed or eliminated by the main baking to further strengthen the coating film. The main baking may be performed at temperatures of 200 degrees Celsius to 1200 degrees Celsius for about 5 minutes to 6 hours. Accordingly, the coating film is cured, and thereby the substrate with the concavity and convexity pattern film which corresponds to the concavity and convexity pattern of the mold, that is, the substrate in which the sol-gel material layer having the concavity and convexity pattern is directly formed on the flat substrate, is obtained. In this situation, depending on a baking temperature and a baking time, the silica, as the sol-gel material layer, is amorphous, crystalline, or in a mixture state of the amorphous and the crystalline.

[Manufacturing Apparatus]

Figure 5:
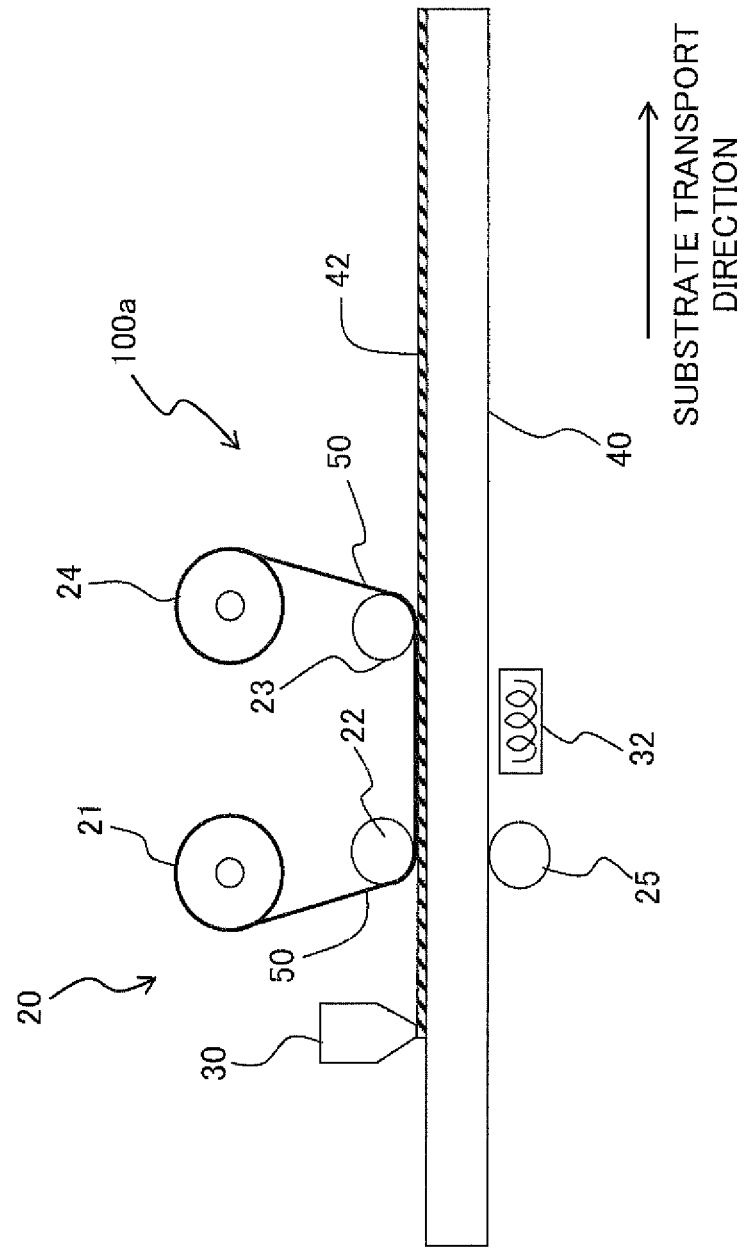
FIG. 5 is a conceptual view illustrating an apparatus used for performing the method of the present invention.

In order to carry out the method of the present invention, it is possible to use, for example, an apparatus 100a for manufacturing the substrate having the concavity and convexity pattern, as shown in FIG. 5. The apparatus 100a mainly includes a die coater 30 for applying the sol on the substrate 40; a transport system 20 for transporting a long mold 50; and a heater 32 for heating the coating film. The transport system 20 includes a feeding roll 21 which feeds the mold 50; a pressing roll 22 which presses the mold 50 to the side of the coating film 42 formed on the substrate 40; a support roll 25 which is provided to face the pressing roll 22 to press the substrate 40 from the lower side of the substrate and which is rotationally driven to feed the substrate to the downstream side in a substrate transport direction; a peeling roll 23 which is provided on the downstream side of the pressing roll 22 to peel off the mold 50 after a state, in which the mold 50 is pressed against the coating film on the substrate, is maintained over a predetermined distance; and a winding roll 24 which is provided on the downstream side of the peeling roll 23 to wind or roll up the mold. The heater 32 is used for the pre-baking and is positioned between the pressing roll 22 and the peeling roll 23 in the substrate transport direction. It is possible to use, for example, an infrared heater, hot-air heating, and a hot plate as the heater 32.

An explanation will be made about an operation for processing the substrate by use of the apparatus 100a. The sol is applied on the substrate 40 by the die coater 30 while the substrate 40 sandwiched between the pressing roll 22 and the support roll 25 is moved to the downstream side. The coating film 42 obtained by applying the sol arrives at the pressing roll 22 after the elapse of a predetermined moving time of the substrate and then the concavity and convexity pattern of the mold 50 fed by the feeding roll 21 is pressed against the coating film 42. The substrate 40 is transported in a state that the concavity and convexity pattern of the mold 50 is pressed against the coating film 42, and the coating film 42 is subjected to the pre-baking when passing above the heater 32. The mold 50 is drawn or pulled upward by the winding roll 24 when passing through the peeling roll 23, so that the mold 50 is peeled off from the coating film 42. Subsequently, the substrate on which the pattern is formed is subjected to the main baking in an oven provided separately from the apparatus 100a. It is allowable to provide a heater in the manufacturing line as the oven used for the main baking.

Figure 6:
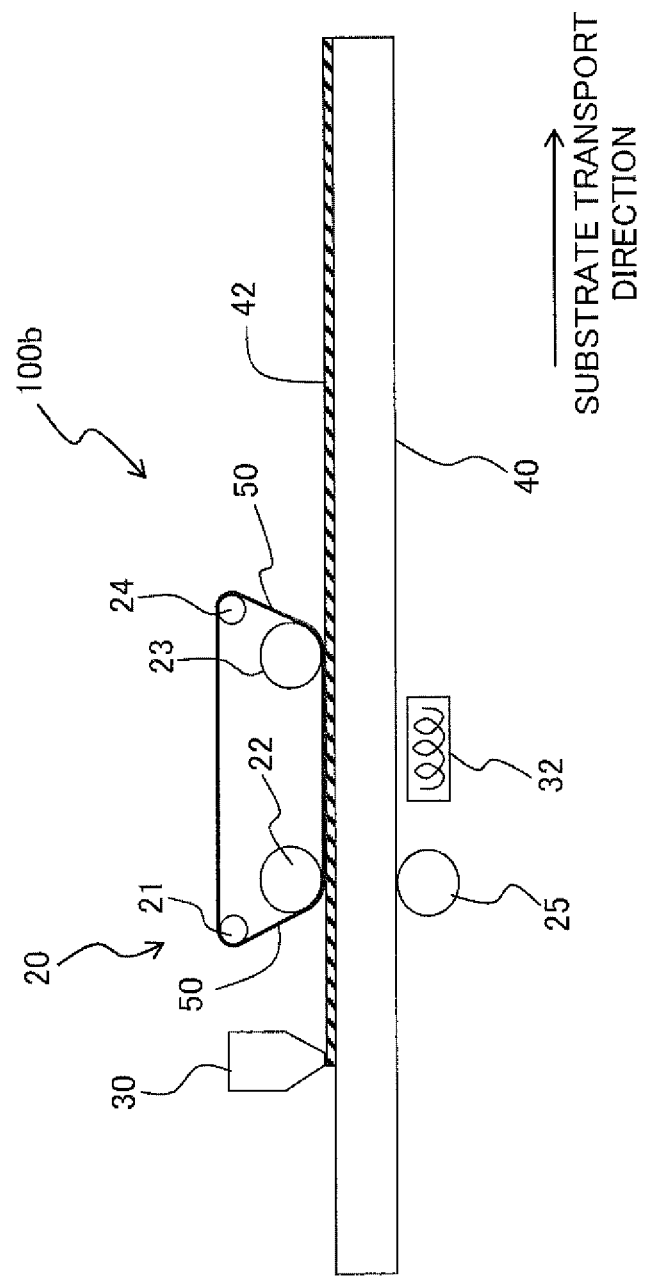
FIG. 6 is a conceptual view illustrating another apparatus used for performing the method of the present invention.

In the apparatus 100a, a peeling angle may be adjusted by controlling or regulating the installation position of the peeling roll 23 and/or the position of the winding roll 24 which winds or rolls up the mold via the peeling roll 23. The heater 32 may be provided on the side of the coating film 42 relative to the substrate 40, and it is possible to use any other driving means such as a movable table which moves while supporting the substrate, instead of the support roll 25. Further, although the peeling roll 23 is used to maintain the state, in which the concavity and convexity pattern of the mold 50 is pressed against the coating film 42 with the pressing roll 22 while the coating film 42 is subjected to the pre-baking by the heater 32, it is allowable to use any other support member such as a plate-shaped member having a smooth surface and a corner with a curved surface, instead of the peeling roll 23, in order to maintain the above state. The mold 50 is formed as the long mold and the end portions thereof are wound on the feeding roll 21 and the winding roll 24, respectively. The mold 50, however, may be formed to be an endless belt like an apparatus 100b shown in FIG. 6. The mold 50 formed to be the endless belt enables a continuous pressing operation also in a manufacturing line in which many substrates are continuously transported for mass production.

Figure 7:
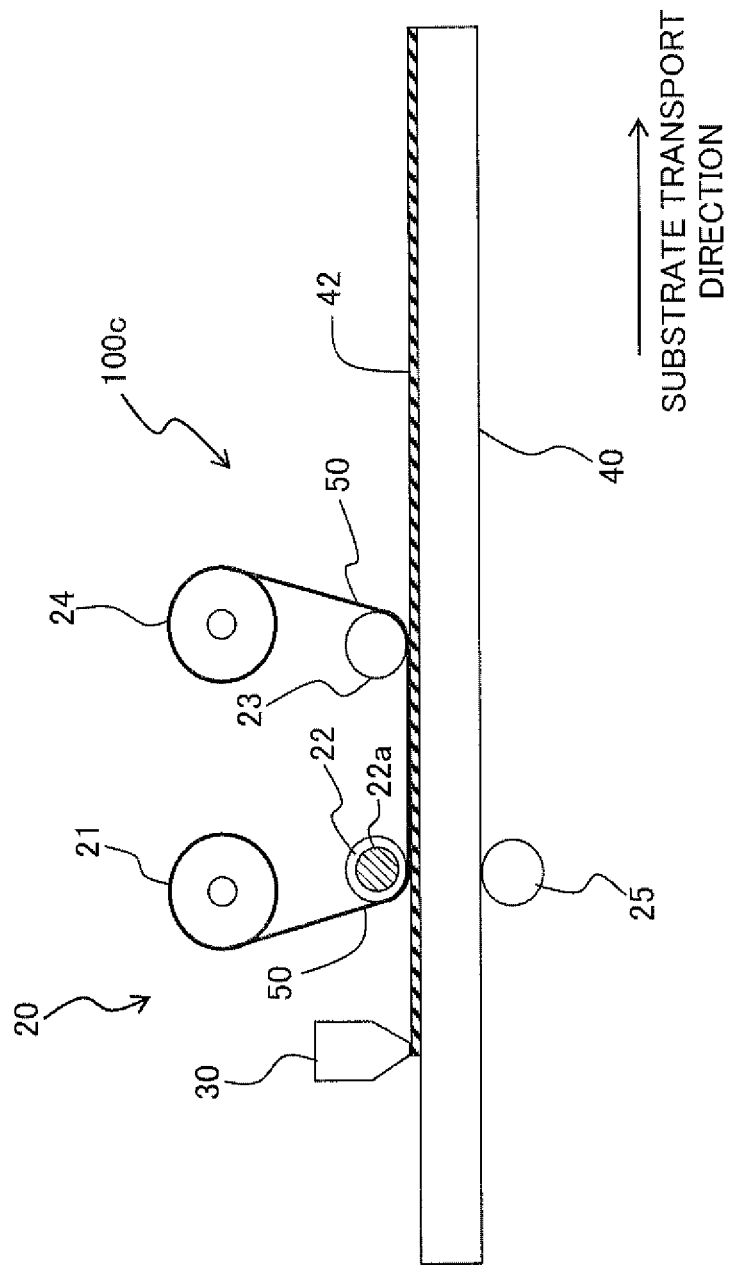
FIG. 7 is a conceptual view illustrating an apparatus used for performing the method using the hot press.

FIG. 7 shows an exemplary apparatus used when the hot press is performed in the pressing step. An apparatus 100c shown in FIG. 7 has basically the same structure as the apparatus 100a shown in FIG. 5, except that the pressing roll 22 includes therein a heater 22a. Although a heater 33 shown in FIG. 5 may be provided between the pressing roll 22 and the peeling roll 23 in the substrate transport direction, since the pressing roll 22 is provided with the heater 22a, the heater 33 can be omitted. In the apparatus 100c, the coating film 42 obtained by applying the sol arrives at the hot press roll 22 after the elapse of a predetermined moving time of the substrate, and then the concavity and convexity pattern of the mold 50 fed by the feeding roll 21 is pressed against the coating film 42 while being heated.

Figure 8:
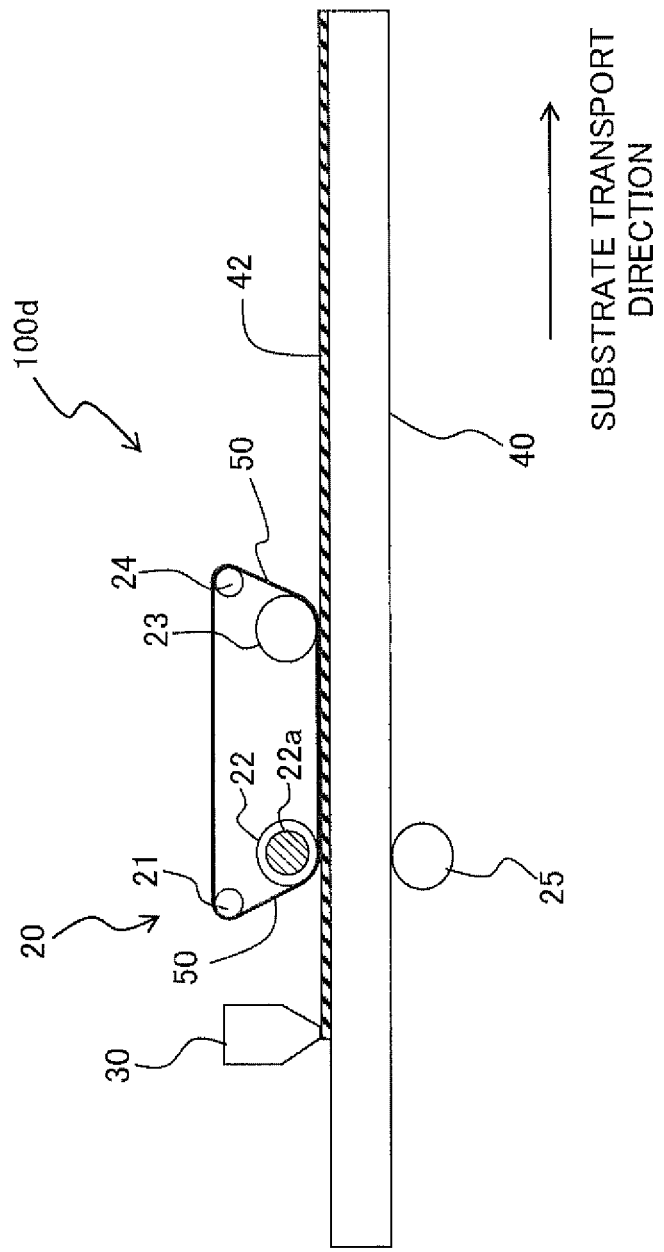
FIG. 8 is a conceptual view illustrating another apparatus used for performing the method using the hot press.

In the apparatus 100c, a peeling angle may be adjusted by controlling or regulating the installation position of the peeling roll 23 and/or the position of the winding roll 24 which winds or rolls up the mold via the peeling roll 23. It is possible to use any other driving means such as a movable table which moves while supporting the substrate, instead of the support roll 25. Although the peeling roll 23 is used to maintain the state, in which the concavity and convexity pattern of the mold 50 is pressed against the coating film 42 with the pressing roll 22, it is allowable to use any other support member such as a plate-shaped member having a smooth surface and a corner with a curved surface, instead of the peeling roll 23, in order to maintain the above state. The mold 50 is formed as a long mold and the end portions thereof are wound on the feeding roll 21 and the winding roll 24, respectively. The mold 50, however, may be formed to be an endless belt like an apparatus 100d shown in FIG. 8. The mold 50 formed to be the endless belt enables a continuous pressing operation also in a manufacturing line in which many substrates are continuously transported for mass production.

Figure 9:
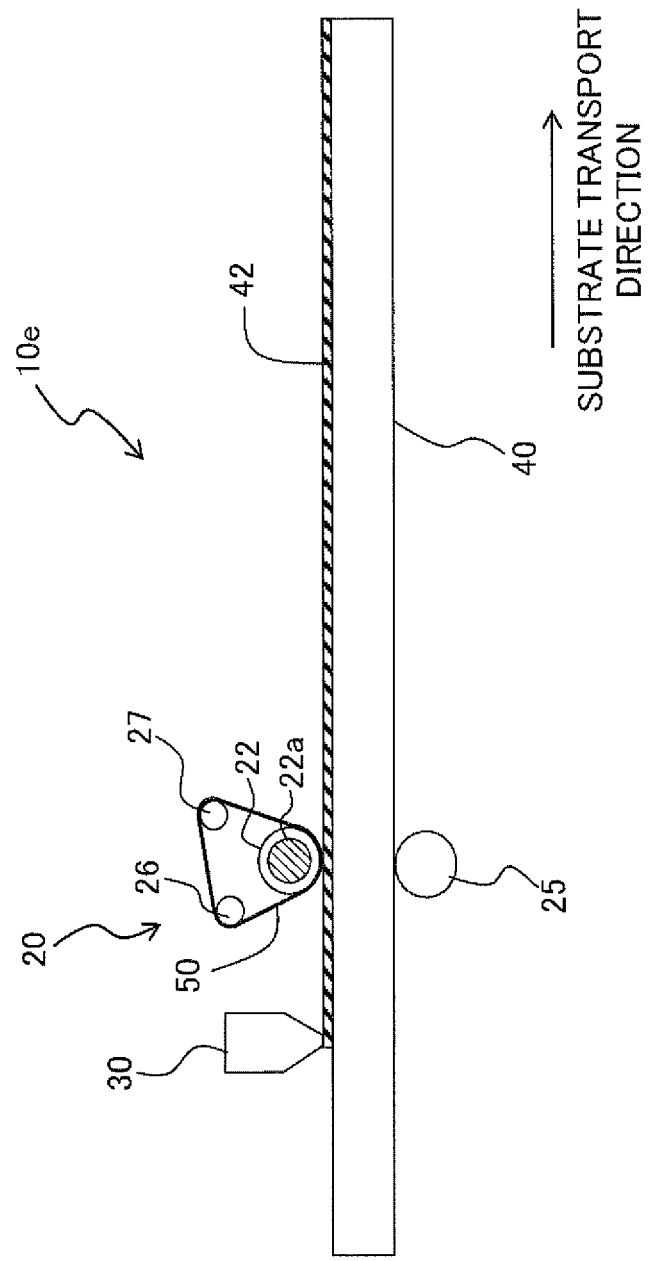
FIG. 9 is a conceptual view illustrating still another apparatus used for performing the method using the hot press.

FIG. 9 shows an exemplary apparatus in which no peeling roll is provided. In an apparatus 100e shown in FIG. 9, the mold 50 fed from a feeding roll 26 is pressed against the coating film 42 with the hot press roll 22, and then the mold 50 is directly wound or lifted with a winding roll 27 to rotate. In the present invention, since the pressing roll is heated, the peeling of the mold from the coating film immediately after the pressing is helped. Thus, it is possible to simplify the apparatus by omitting the peeling roll and improve productivity of the process. It is allowable that the feeding roll and the winding roll are not provided and the mold is wound around the hot press roll directly.

Figure 10:
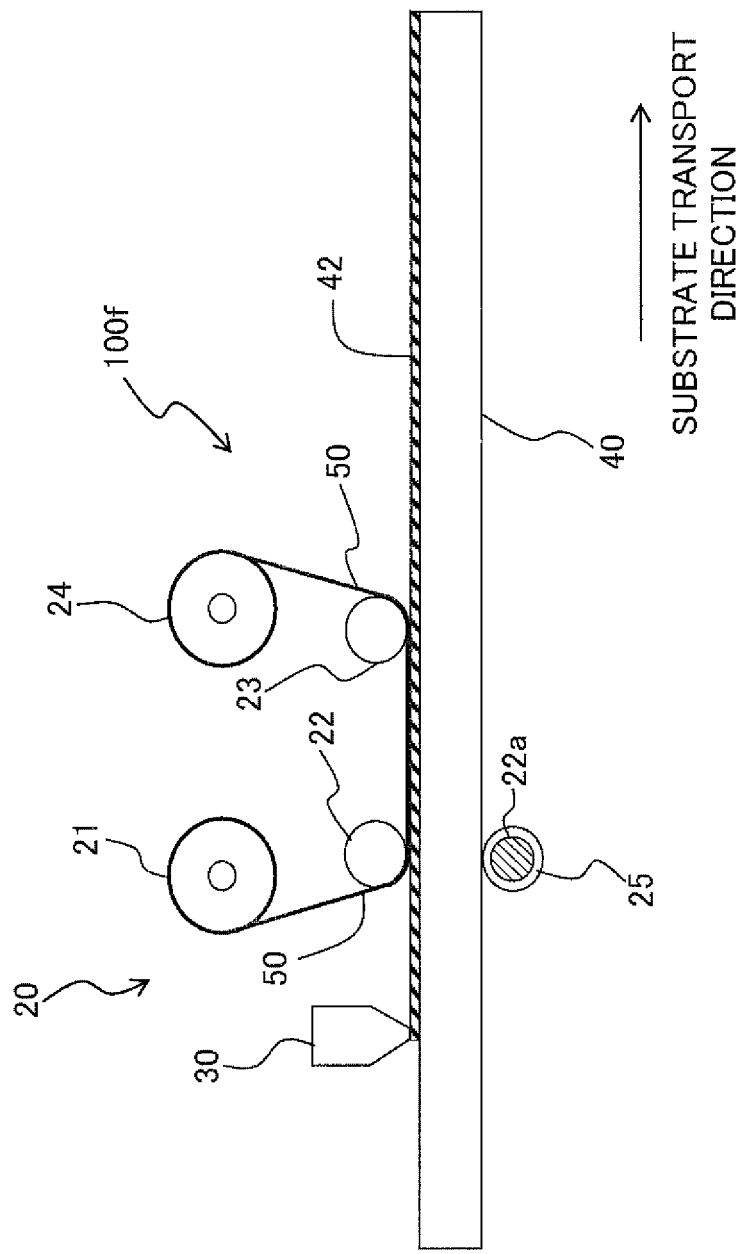
FIG. 10 is a conceptual view illustrating yet another apparatus used for performing the method using the hot press.

As shown in an apparatus 100f shown in FIG. 10, instead of providing the heater 22a in the pressing roll 22, the heater 22a may be provided in the support roll 25. In this case, the coating film 42 is subjected to the pre-baking by heat generated from the heater 22a provided in the support roll 25. Alternatively, the heater 22a may be provided both in the pressing roll 22 and in the support roll 25.

Figure 11:
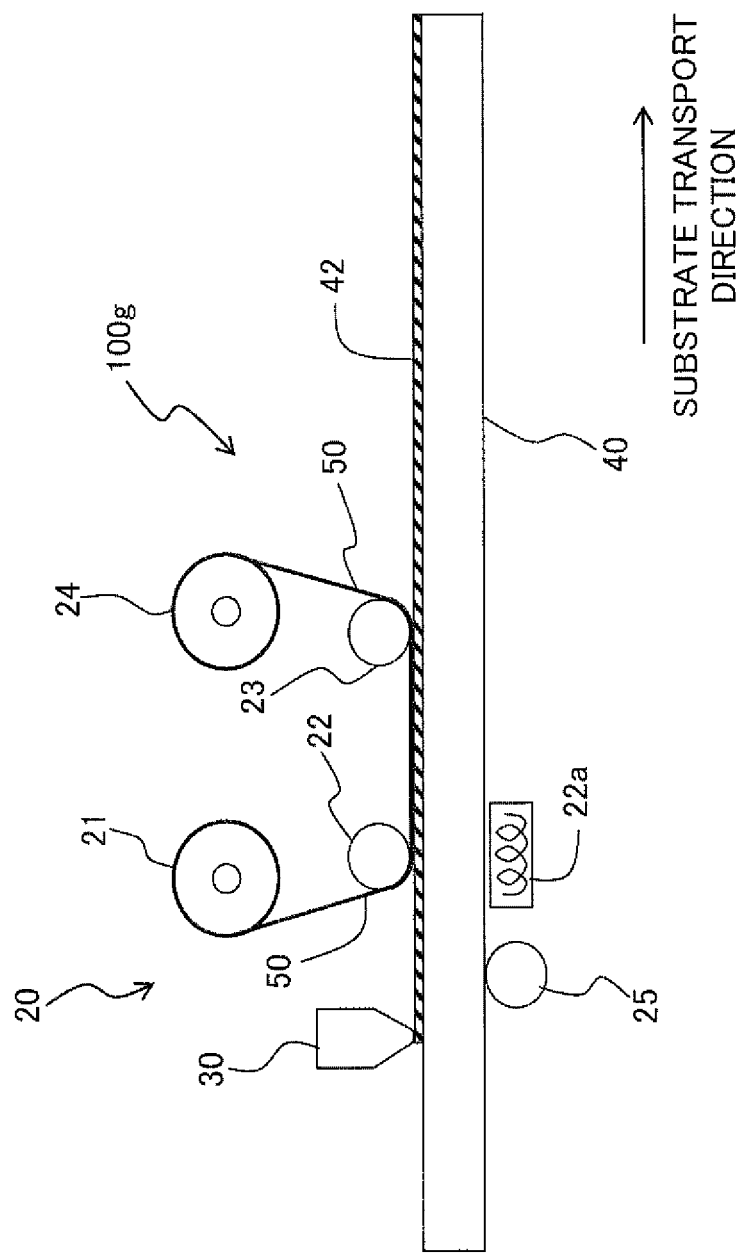
FIG. 11 is a conceptual view illustrating further apparatus used for performing the method using the hot press.

FIG. 11 shows another modified example of the arrangement of the heater 22a. Instead of providing the heater 22a in the pressing roll 22, the heater 22b may be provided immediately below the pressing roll 22 as in the case of an apparatus 100g shown in FIG. 11. In this case, the coating film 42 is subjected to the pre-baking by the heater 22b provided immediately below the pressing roll 22. Alternatively, the heater 22a and 22b may be provided both inside the pressing roll and at the position immediately below the pressing roll 22.

Figure 12:
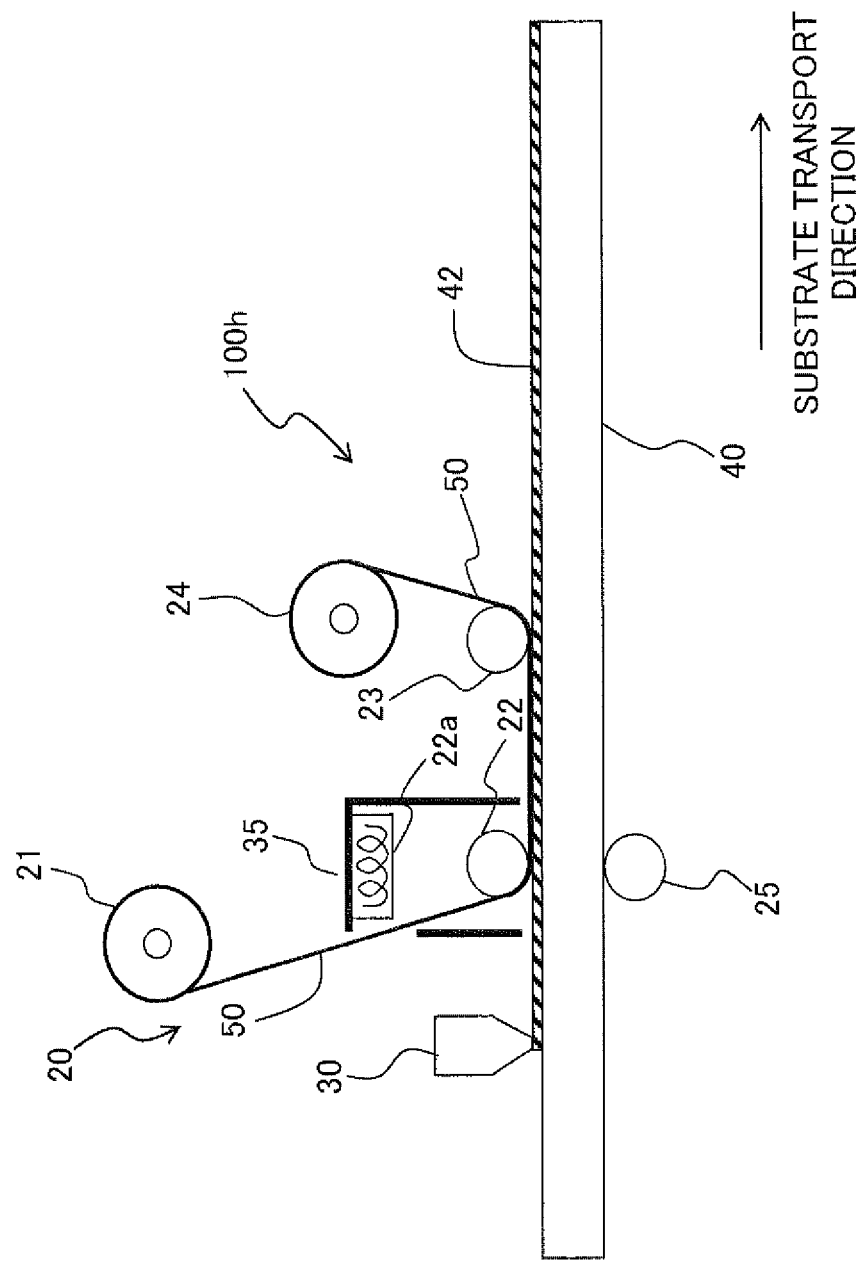
FIG. 12 is a conceptual view illustrating still further apparatus used for performing the method using the hot press.

FIG. 12 shows still another example of the arrangement of the heater 22a. As shown in FIG. 12, instead of providing the heater 22a in the pressing roll 22, an apparatus 100h includes the heater 22b in a heat zone 35 which is arranged at the periphery of the pressing roll 22 by being partitioned by a separation wall. Since the heater is provided in the heat zone 35, the inside of the heat zone is maintained at a heating temperature. In this case, the coating film 42 is subjected to the pre-baking in the heat zone 35. The heater may be provided not only in the heat zone 35 but also in the support roll 25.

The substrate, in which the pattern made of the sol-gel material layer 42 is formed through the roll process as described above, can be used as, for example, a diffraction-grating substrate for organic EL element, a wire grid polarizer, an antireflection film, and an optical element for providing an effect of a confinement of light within a solar cell by being placed on the photoelectric conversion surface side of the solar cell. Or, the pattern may be transferred to yet another resin by using the substrate having the pattern as the mold (mother die). In this case, the transferred resin pattern is an inverted pattern of the pattern on the substrate. Thus, it is allowable to produce a mold as a replica of the substrate by transferring the transferred inverted pattern to yet another resin. Each of the molds can be subjected to an electroforming process using Ni and the like to form a metallic mold. The use of each of the molds enables efficient mass production of an optical component such as the diffraction-grating substrate for organic EL element.

<Method for Producing Organic EL Element>

Figure 13:
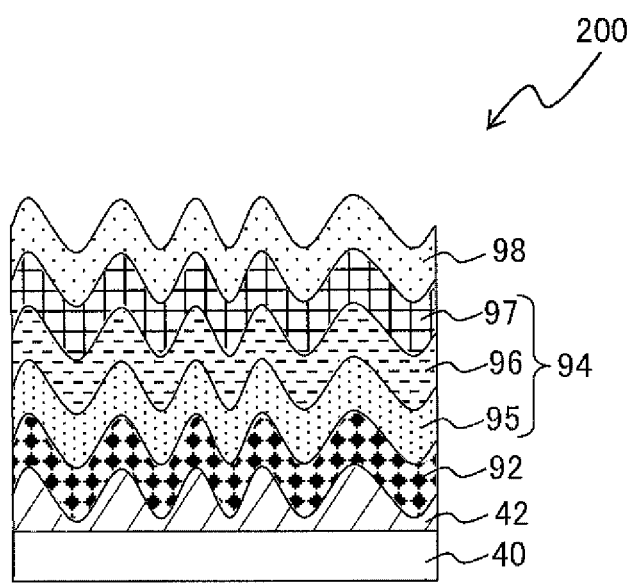
FIG. 13 shows a cross-section structure of an organic EL element.

An explanation will be made about a method for producing an organic EL element by use of the substrate, in which the pattern made of the sol-gel material layer is formed through the roll process as described above, while referring to FIG. 13. At first, as shown in FIG. 13, a transparent electrode 92 is stacked on the sol-gel material layer 42 on the substrate 40 to maintain the concave and convex structure formed on the surface of the sol-gel material layer 42. As a material for the transparent electrode 92, for example, indium oxide, zinc oxide, tin oxide, indium-tin oxide (ITO) which is a composite material thereof, gold, platinum, silver, or copper can be used. Of these materials, ITO is preferable from the viewpoint of transparency and electrical conductivity. The thickness of the transparent electrode 92 is preferably in a range of 20 to 500 nm. In a case that the thickness is less than the lower limit, the electrical conductivity is more likely to be insufficient. In a case that the thickness exceeds the upper limit, there is possibility that the transparency is so insufficient that emitted EL light cannot be extracted to the outside sufficiently. As a method for stacking the transparent electrode 92, any known method such as a vapor deposition method, a sputtering method, and a spin coating method can be employed as appropriate. Of these methods, the sputtering method is preferably employed from the viewpoint of improving the adhesion property.

Next, an organic layer 94 as shown in FIG. 13 is stacked on the transparent electrode 92. The organic layer 94 is not particularly limited, provided that the organic layer 94 is usable as an organic layer of the organic EL element. As the organic layer 94, any known organic layer can be used as appropriate. The organic layer 94 may be a stacked body of various organic thin films. For example, the organic layer 94 may be a stacked body of a hole transporting layer 95, a light-emitting layer 96, and an electron transporting layer 97 as shown in FIG. 13. Here, examples of materials of the hole transporting layer 95 include aromatic diamine compounds such as phthalocyanine derivatives, naphthalocyanine derivatives, porphyrin derivatives, N,N'-bis(3-methylphenyl-(1,1'-biphenyl)-4,4'-diamine (TPD), and 4,4'-bis[N-(naphthyl)-N-phenyl-amino]biphenyl(α-NPD); oxazole; oxadiazole; triazole; imidazole; imidazolone; stilbene derivatives; pyrazoline derivatives; tetrahydroimidazole; polyarylalkane; butadiene; and 4,4',4"-tris(N-(3-methylphenyl)N-phenylamino)triphenylamine (m-MTDATA). The materials of the hole transporting layer, however, are not limited thereto. By providing the light emitting layer 96, a hole injected from the transparent electrode 92 and electron injected from a metal electrode 98 are recombined to occur light emission. Examples of materials of the light emitting layer 96 include metallo-organic complex such as anthracene, naphthalene, pyrene, tetracene, coronene, perylene, phthaloperylene, naphthaloperylene, diphenylbutadiene, tetraphenylbutadiene, coumarin, oxadiazole, bisbenzoxazoline, bisstyryl, cyclopentadiene, and aluminum-quinolinol complex (Alq3); tri-(p-terphenyl-4-yl)amine; 1-aryl-2,5-di(2-thienyl)pyrrole derivatives; pyran; quinacridone; rubren; distyrylbenzene derivatives; distyryl arylene derivatives; distyryl amine derivatives; and various fluorescent pigments or dyes. Further, it is preferable that light-emitting materials selected from the above compounds are mixed as appropriate and then are used. Furthermore, it is possible to preferably use a material system generating emission of light from a spin multiplet, such as a phosphorescence emitting material generating emission of phosphorescence and a compound including, in a part of the molecules, a constituent portion formed by the above materials. The phosphorescence emitting material preferably includes heavy metal such as iridium. A host material having high carrier mobility may be doped with each of the light-emitting materials as a guest material to generate the light emission using dipole-dipole interaction (Forster mechanism), or electron exchange interaction (Dexter mechanism). Examples of materials of the electron transporting layer 97 include heterocyclic tetracarboxylic anhydrides such as nitro-substituted fluorene derivatives, diphenylquinone derivatives, thiopyran dioxide derivatives, and naphthalenecperylene; and metallo-organic complex such as carbodiimide, fluorenylidene methane derivatives, anthraquino dimethane and anthrone derivatives, oxadiazole derivatives, and aluminum-quinolinol complex (Alq3). Further, in the oxadiazole derivatives mentioned above, it is also possible to use, as an electron transporting material, thiadiazole derivatives in which oxygen atoms of oxadiazole rings are substituted by sulfur atoms and quinoxaline derivatives having quinoxaline rings known as electron attractive group. Furthermore, it is also possible to use a polymeric material in which the above materials are introduced into a macromolecular chain or the above materials are made to be a main chain of the macromolecular chain. It is noted that the hole transporting layer 95 or the electron transporting layer 97 may also function as the light-emitting layer 96. In this case, there are two organic layers between the transparent electrode 92 and the metal electrode 98.

From the viewpoint of facilitating the electron injection from the metal electrode 98, it is allowable to provide, between the organic layer 94 and the metal electrode 98 as an electron injecting layer, a layer made of a metal fluoride such as lithium fluoride (LiF), a metal oxide such as or $Li_2O_3$, a highly active alkaline earth metal such as Ca, Ba, or Cs, an organic insulating material, or the like. In addition, from the viewpoint of facilitating the hole injection from the transparent electrode 92, it is allowable to provide, between the organic layer 94 and the transparent electrode 92 as the hole injecting layer, a layer made of triazole derivatives; oxadiazole derivatives; imidazole derivatives; polyarylalkane derivatives; pyrazoline derivatives and pyrazolone derivatives; phenylenediamine derivatives; arylamine derivatives; amino-substituted chalcone derivatives; oxazole derivatives; styrylanthracene derivatives; fluorenon derivatives; hydrazone derivatives; stilbene derivatives; silazane derivatives; aniline copolymer, or a conductive polymer oligomer, in particular, thiophene oligomer, or the like.

In a case that the organic layer 94 is a stacked body formed of the hole transporting layer 95, the light-emitting layer 96, and the electron transporting layer 97, the thicknesses of the hole transporting layer 95, the light-emitting layer 96, and the electron transporting layer 97 are preferably in a range of 1 to 200 nm, in a range of 5 to 100 nm, and in a range of 5 to 200 nm, respectively. As a method for stacking the organic layer 94, any known method such as a vapor deposition method, a sputtering method, a spin coating method, and a die coating method can be employed as appropriate.

Subsequently, as shown in FIG. 13, the metal electrode 98 is stacked on the organic layer 94 in the step of forming the organic EL element. Materials of the metal electrode 98 are not particularly limited, and a substance having a small work function can be used as appropriate. Examples of the materials include aluminum, MgAg, MgIn, and AlLi. The thickness of the metal electrode 98 is preferably in a range of 50 to 500 nm. In a case that the thickness is less than the lower limit, the electrical conductivity is more likely to be decreased. In a case that the thickness exceeds the upper limit, there is possibility that the repair or restoration is difficult when a short circuit between electrodes occurs. Any known method such as a vapor deposition method and a sputtering method can be adopted to stack the metal electrode 98. Accordingly, an organic EL element 200 having a structure as shown in FIG. 13 can be obtained.

EXAMPLES

Example 1

Figure 2:
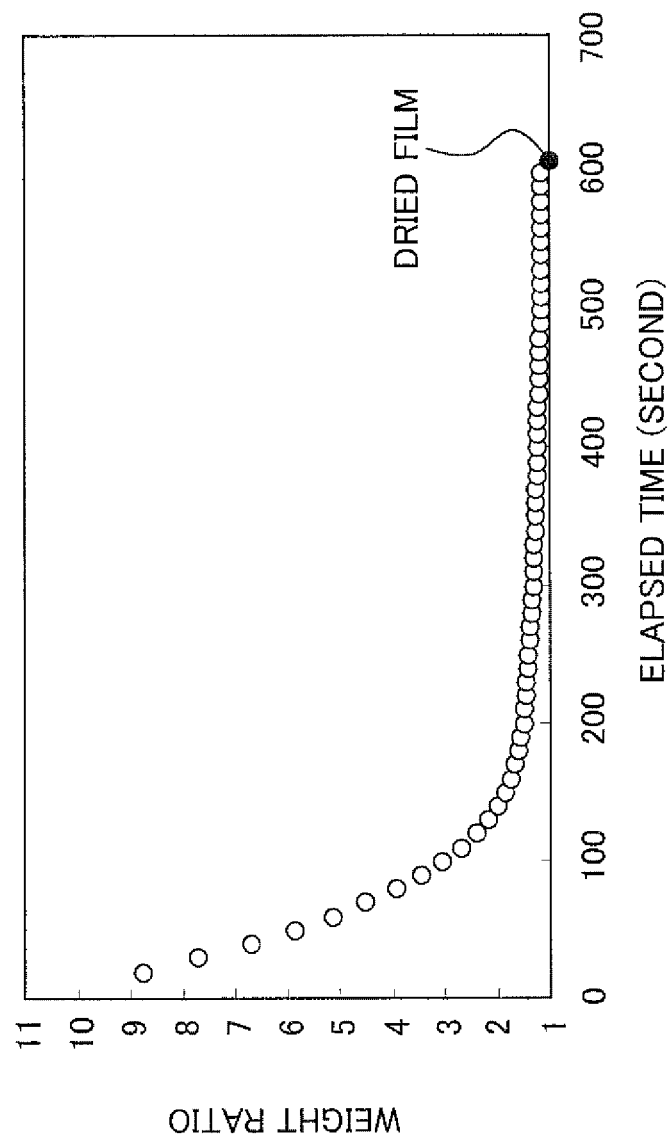
FIG. 2 is a graph showing a relationship between the time elapsed after a sol is applied on a glass substrate by use of a bar coater and the ratio of weight of a coating film to dried weight of the coating film.

2.5 g of tetraethoxysilane (TEOS) and 2.1 g of methyltriethoxysilane (MTES) were added by drops to a mixture of 24.3 g of ethanol, 2.16 g of water, and 0.0094 g of concentrated hydrochloric acid, followed by being stirred for 2 hours at a temperature of 23 degrees Celsius and humidity of 45% to obtain a sol. The sol was applied on a soda-lime glass plate of 15×15×0.11 cm by a bar coating. Doctor Blade (manufactured by Yoshimitsu Seiki Co., Ltd.) was used as a bar coater. The doctor blade was designed so that the film thickness of the coating film was 5 μm. However, the doctor blade was adjusted so that the film thickness of the coating film was 40 μm by sticking an imide tape having a thickness of 35 μm to the doctor blade. The weight of the glass plate (glass substrate) after the bar coating was weighed every time when a predetermined period of time elapses by use of an electric weighing machine (produced by Kensei Industry Co., Ltd., electromagnetic weighing machine "GH-202"). Then, the weight (b(t)) of the coating film was obtained for each elapsed time by subtracting the weight of the glass substrate which was weighed in advance. Further, the glass substrate was subjected to a heating process on a hot plate at a temperature of 100 degrees Celsius for 5 minutes to dry the coating film, and the weight of the glass substrate was weighed by the electric weighing machine. Then, the weight of the dried film (a=8.6 mg) was obtained by subtracting the weight of the glass substrate which was weighed in advance. The ratio (e=b(t)/a) of weight of the coating film to a dried weight "a" of the coating film was calculated for each elapsed time "t", and evaluation of the transfer of the coating film was performed based on the weight ratio as follows. FIG. 2 shows a graph showing the variation of the ratio (e=b(t)/a) of weight of the coating film to the dried weight of the coating film for each elapsed time (second).

The sol was prepared under the same conditions, and then the sol was applied on a soda-lime glass plate by the bar coating as those described above. After the application of the sol, a mold having a line-and-space pattern was pressed against the coating film on the glass plate with a pressing roll, for each elapsed time which was the same as that when the weight of the glass substrate was obtained, in the following manner.

Figure 14A:
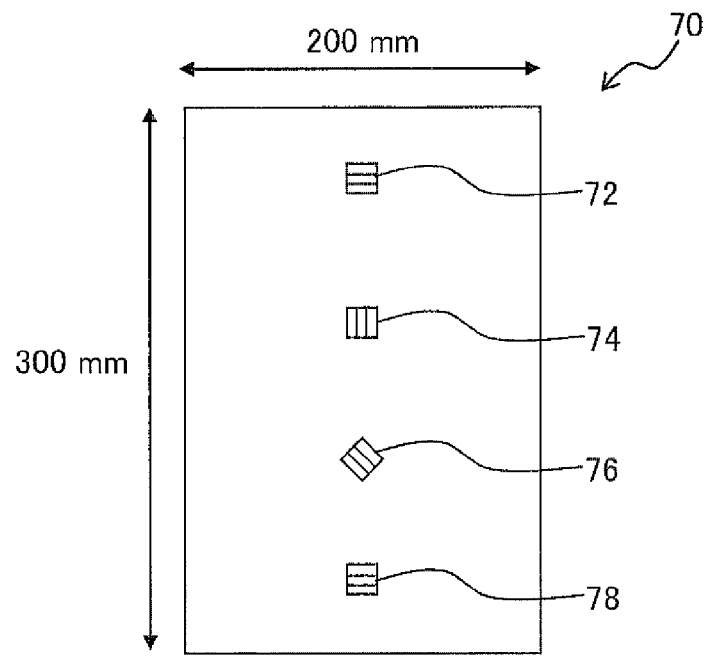
Figure 14B:
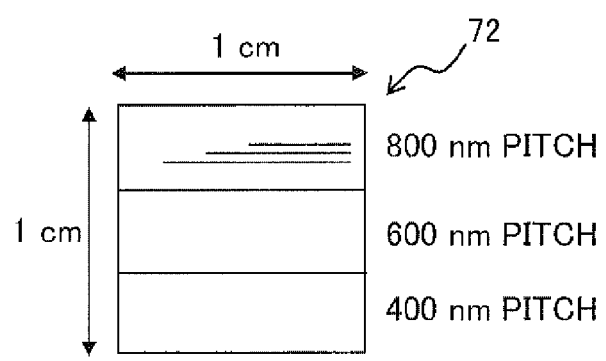
Figure 14C:
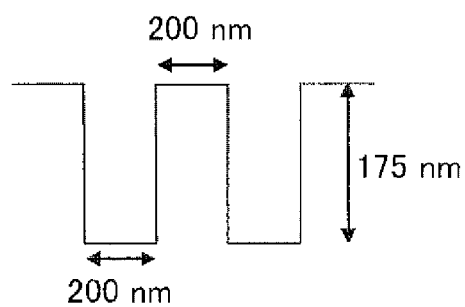

The mold having the line-and-space pattern was made as follows. The line-and-space pattern was formed on a silicon substrate by electron beam lithography as a master. The pattern of the master was transferred on a fluorine-containing photo-curable resin layer applied on a PET film to prepare the mold. As shown in FIG. 14A, the mold was a sheet 70 of 300 mm×200 mm×0.1 (thickness) mm, and four line-and-space patterns (each having 1 cm×1 cm) 72, 74, 76, 78, which had concave and convex grooves extending in mutually different directions, and each of which was formed providing a predetermined spacing distance therebetween, were formed in a surface of the sheet 70. As shown in FIG. 14B, each of the patterns was formed to be partitioned into three, and three portions of the partitioned pattern had pitches of 400 nm, 600 nm, and 800 nm, respectively. The concavities and convexities in each of the three portions of the partitioned pattern had a depth of 175 nm. FIG. 14C is a cross-sectional view of the partitioned pattern having a pitch of 400 nm. As the pressing roll, it was used a roll which had an outer periphery covered with EPDM having a thickness of 3 mm; had a roll diameter (ϕ) of 70 mm; and had a length of 500 mm in the axial direction of the shaft.

At first, the surface, of the mold, on which the line-and-space pattern has been formed was pressed against the coating film on the glass substrate while rotating the pressing roll of which temperature was 23 degrees Celsius (room temperature) from one end to the other end of the glass substrate. Immediately after the completion of the pressing, the substrate was moved on a hot plate and then heated at a temperature of 100 degrees Celsius (pre-baking). After continuing the heating for 5 minutes, the substrate was removed from the hot plate and the mold was manually peeled off from the substrate from an end portion thereof. The mold was peeled off such that the angle (peel angle) of the mold with respect to the substrate was about 30°.

After peeling off the mold from the substrate, the transfer state of the line-and-space pattern on the coating film was observed visually. When the line-and-space pattern on the coating film could be observed, it was evaluated as transferable. The evaluation results are shown in Table 1. Table 1 shows the time elapsed after the application and before the pressing; the weight of the coating film; the ratio of weight of the coating film to the dried weight of the coating film; and the evaluation results. In a case that the line-and-space pattern was clearly transferred on the coating film, it is expressed as "+" and in a case that no line-and-space pattern was observed and evaluated as transfer failure, it is expressed as "−" in each column of Table 1.

TABLE 1

| Time elapsed after application (second) | Weight of coating film (mg) | Weight ratio to dried film (*1) | Evaluation |
|---|---|---|---|
| 10 | | | |
| 20 | 75.3 | 8.76 | + |
| 30 | 66.1 | 7.69 | + |
| 40 | 57.5 | 6.69 | + |
| 50 | 50.3 | 5.85 | + |
| 60 | 43.8 | 5.09 | + |
| 70 | 38.6 | 4.49 | + |
| 80 | 33.7 | 3.92 | + |
| 90 | 29.6 | 3.44 | + |
| 100 | 26.0 | 3.02 | + |
| 110 | 23.0 | 2.67 | + |
| 120 | 20.6 | 2.40 | + |
| 130 | 18.6 | 2.16 | + |
| 140 | 17.2 | 2.00 | + |
| 150 | 15.9 | 1.85 | + |
| 160 | 14.9 | 1.73 | + |
| 170 | 14.2 | 1.65 | + |
| 180 | 13.6 | 1.58 | + |
| 190 | 13.2 | 1.53 | + |
| 200 | 12.8 | 1.49 | + |
| 210 | 12.6 | 1.47 | + |
| 220 | 12.5 | 1.45 | + |
| 230 | 12.3 | 1.43 | + |
| 240 | 12.1 | 1.41 | + |
| 250 | 11.9 | 1.38 | − |
| 260 | 11.7 | 1.36 | − |
| 270 | 11.6 | 1.35 | − |
| 280 | 11.5 | 1.34 | − |

TABLE 1-continued

| Time elapsed after application (second) | Weight of coating film (mg) | Weight ratio to dried film (*1) | Evaluation |
|---|---|---|---|
| 290 | 11.4 | 1.33 | − |
| 300 | 11.2 | 1.30 | − |
| 310 | 11.2 | 1.30 | − |
| Drying at 100 deg C. for 5 minutes | 8.60 | 1.00 | |

(*1) The weight of the film dried at 100 degrees Celsius for 5 minutes was defined as 1.

The results in Table 1 show that the transfer was satisfactory in a case that the ratio of weight of the coating film to the dried weight of the coating film was in a range of 1.4 to 8.8. That is, in terms of the time elapsed after the application, the transfer was satisfactory in a case that the elapsed time was in a range of 20 seconds to 240 seconds. Note that in a case that the weight exceeded 4.0, the sol applied by the bar coater flowed and leaked from the substrate, so that the sol came around behind the substrate. This made an area around the substrate dirty.

Of the glass substrates each having the coating film to which the line-and-space pattern was transferred, the substrate(s) to which the line-and-space pattern was clearly transferred was(were) subjected to a main baking by heating the substrate(s) for 60 minutes in an oven of 300 degrees Celsius.

Example 2

Figure 15:
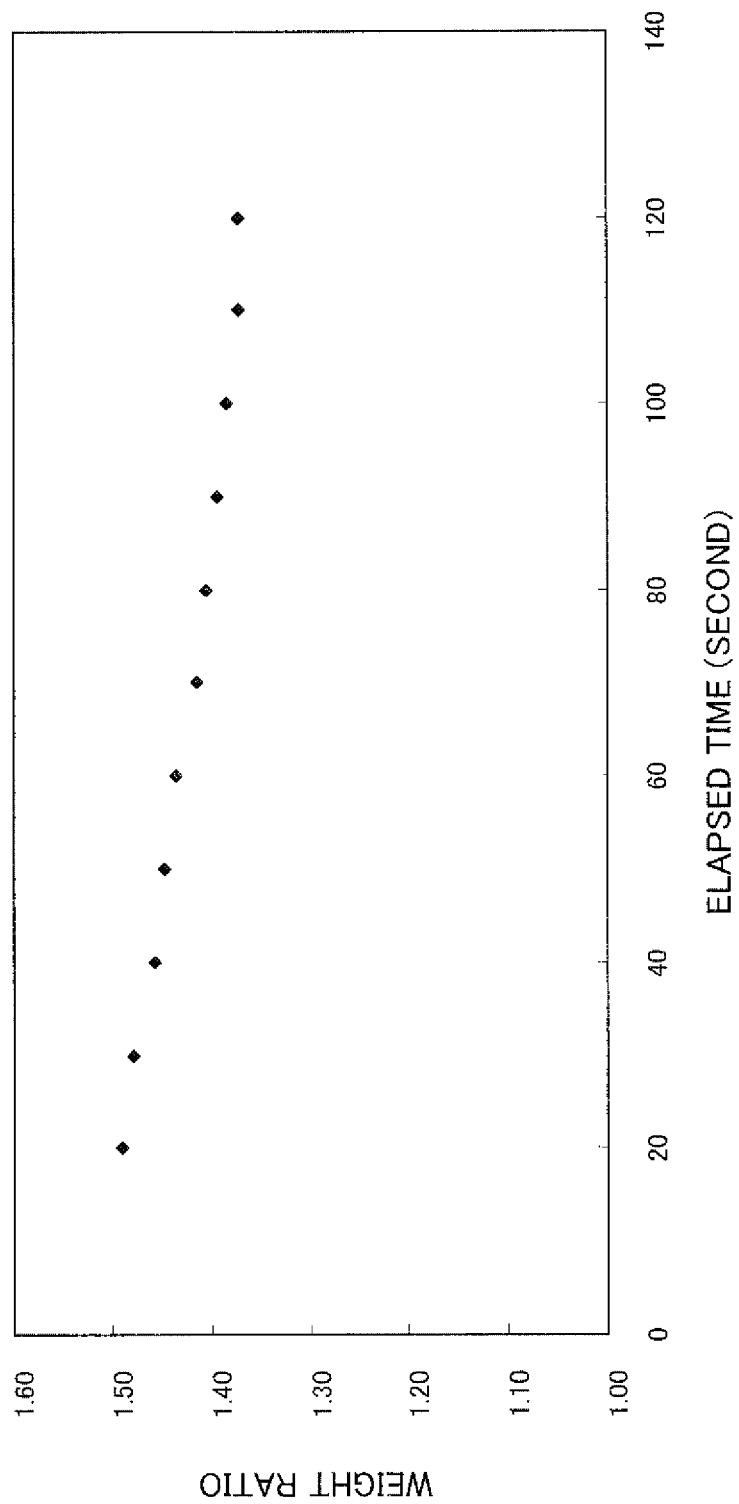
FIG. 15 is a graph showing a relationship between the time elapsed after a sol is applied on a glass substrate by use of a spin coater and the ratio of weight of a coating film to dried weight of the coating film in Example 2.

A sol was prepared in the same manner as Example 1, except that 31.7 g of isopropyl alcohol (IPA) was used instead of ethanol used in the sol. A spin coating method was used as the method for applying the sol other than the bar coating method. The spin coating was performed at a spin speed of 500 rpm for 8 seconds, and then performed at a spin speed of 1000 rpm for 3 seconds. The weight of the glass substrate was weighed for each elapsed time after the spin coating in the same manner as Example 1. Then, it was obtained the ratio of weight of the glass substrate to the weight (dried weight) of the substrate, the dried weight being obtained by heating the substrate at a temperature of 100 degrees Celsius for 5 minutes. FIG. 15 shows the variation of the ratio (e=b(t)/a) of weight of the coating film to the dried weight of the coating film for each elapsed time after the spin coating. Subsequently, the mold was pressed against the coating film of the sol, which was obtained by performing the spin coating on the glass substrate, by use of the pressing roll of which temperature was 23 degrees Celsius, while the pressing roll was moved and rotated, for each elapsed time in the same manner as Example 1. After the completion of pressing of the coating film, the mold was manually peeled off from the substrate after the substrate was heated at a temperature of 100 degrees Celsius in the same manner as Example 1. Then, the pattern transferred to the coating film was observed and evaluated.

Table 2 shows the evaluation results. The following is understood from the results. That is, even when the sol is applied by the spin coater and when isopropyl alcohol is used as the solvent of the sol, the transfer can be performed satisfactorily provided that the ratio "e" of weight of the coating film to the dried weight of the coating film is not less than 1.4.

TABLE 2

| Time elapsed after application (second) | Weight of coating film (mg) | Weight ratio to dried film (*1) | Evaluation |
|---|---|---|---|
| 10 | | | |
| 20 | 14.0 | 1.49 | + |
| 30 | 13.9 | 1.48 | + |
| 40 | 13.7 | 1.46 | + |
| 50 | 13.6 | 1.45 | + |
| 60 | 13.5 | 1.44 | + |
| 70 | 13.3 | 1.41 | + |
| 80 | 13.2 | 1.40 | + |
| 90 | 13.1 | 1.39 | − |
| 100 | 13.0 | 1.38 | − |
| 110 | 12.9 | 1.37 | − |
| 120 | 12.9 | 1.37 | − |
| Drying at 100 deg C. for 5 minutes | 9.40 | 1.00 | |

(*1) The weight of the film dried at 100 degrees Celsius for 5 minutes was defined as 1

Example 3

In this Example, a mold having a concave and convex surface was produced by using the BCP method, and then a diffraction grating and an organic EL element including the diffraction grating were produced using the produced mold and the pressing roll used in Example 1. At first, it was prepared a block copolymer produced by Polymer Source Inc., which was made of polystyrene (hereinafter referred to as "PS" in an abbreviated manner as appropriate) and polymethyl methacrylate (hereinafter referred to as "PMMA" in an abbreviated manner as appropriate) as described below.

Mn of PS segment=868,000
Mn of PMMA segment=857,000
Mn of block copolymer=1,725,000
Volume ratio between PS segment and PMMA segment (PS: PMMA)=53:47
Molecular weight distribution (Mw/Mn)=1.30
Tg of PS segment=96 degrees Celsius
Tg of PMMA segment=110 degrees Celsius The volume ratio of the first polymer segment and second polymer segment (the first polymer segment:the second polymer segment) in each block copolymer was calculated on the assumption that the density of polystyrene was 1.05 g/cm$^3$, the density of polymethyl methacrylate was 1.19 g/cm$^3$. The number average molecular weights (Mn) and the weight average molecular weights (Mw) of polymer segments or polymers were measured by using gel permeation chromatography (Model No: "GPC-8020" manufactured by Tosoh Corporation, in which TSK-GEL SuperH1000, SuperH2000, SuperH3000, and SuperH4000 were connected in series). The glass transition temperatures (Tg) of polymer segments were measured by use of a differential scanning calorimeter (manufactured by Perkin-Elmer under the product name of "DSC7"), while the temperature was raised at a rate of temperature rise of 20 degrees Celsius/min over a temperature range of 0 degrees Celsius to 200 degrees Celsius. The solubility parameters of polystyrene and polymethyl methacrylate were 9.0 and 9.3, respectively (see Kagaku Binran Ouyou Hen (Handbook of Chemistry, Applied Chemistry), 2nd edition).

Toluene was added to 150 mg of the block copolymer and 38 mg of Polyethylene Glycol 4000 manufactured by Tokyo Chemical Industry Co., Ltd. (Mw=3000, Mw/Mn=1.10) as polyethylene oxide so that the total amount thereof was 10 g, followed by dissolving them. Then, the solution was filtrated or filtered through a membrane filter having a pore diameter of 0.5 μm to obtain a block copolymer solution. The obtained block copolymer solution was applied, on a polyphenylene sulfide film (TORELINA manufactured by TORAY INDUSTRIES, INC.) as a base member, in a film thickness of 200 to 250 nm, by a spin coating. The spin coating was performed at a spin speed of 500 rpm for 10 seconds, and then performed at a spin speed of 800 rpm for 30 seconds. The thin film applied by the spin coating was left at room temperature for 10 minutes until the thin film was dried.

Subsequently, the base member on which the thin film was formed was heated for 5 hours in an oven of 170 degrees Celsius (first annealing process). Concavities and convexities were observed on a surface of the heated thin film, and it was found out that micro phase separation of the block copolymer forming the thin film was caused.

The thin film heated as described above was subjected to an etching process as described below to selectively decompose and remove PMMA on the base member. The thin film was irradiated with UV light at an irradiation intensity of 30 J/cm$^2$ (wavelength of 365 nm) by use of a high pressure mercury lamp. Then, the thin film was immersed in acetone, and was subjected to cleaning with ion-exchanged water, followed by being dried. As a result, there was formed, on the base member, a concavity and convexity pattern clearly deeper than the concavities and convexities which appeared on the surface of the thin film by the heating process.

Next, the base member was subjected to a heating process (second annealing process) for 1 hour in an oven of 140 degrees Celsius so that the concavity and convexity pattern formed by the etching process was deformed to have a chevron-shaped structure (process for forming a shape of chevrons).

A thin nickel layer of about 10 nm was formed as a current seed layer by sputtering on the surface of the thin film, for which the process for forming the shape of chevrons had been performed. Subsequently, the base member with the thin film was subjected to an electroforming process (maximum current density: 0.05 A/cm$^2$) in a nickel sulfamate bath at a temperature of 50 degrees Celsius to precipitate nickel until the thickness of nickel became 250 μm. The base member with the thin film was mechanically peeled off from the nickel electroforming body obtained as described above. Subsequently, the nickel electroforming body was immersed in Chemisol 2303 manufactured by The Japan Cee-Bee Chemical Co., Ltd., followed by being cleaned while being stirred for 2 hours at 50 degrees Celsius. Thereafter, polymer component(s) adhered to a part of the surface of the electroforming body was(were) removed by repeating the following process three times. That is, an acrylic-based UV curable resin was applied on the nickel electroforming body; and the applied acrylic-based UV curable resin was cured; and then the cured resin was peeled off.

Subsequently, the nickel electroforming body was immersed in OPTOOL HD-2100TH manufactured by Daikin Industries, Ltd. for about 1 minute and was dried, and then stationarily placed overnight. The next day, the nickel electroforming body was immersed in OPTOOL HD-TH manufactured by Daikin Industries, Ltd. to perform an ultrasonic cleaning process for about 1 minute. Accordingly, a nickel mold (nickel substrate) for which a mold-release treatment had been performed was obtained.

Subsequently, a fluorine-based UV curable resin was applied on a PET substrate (easily-adhesion PET film manufactured by Toyobo Co., Ltd., product name: COSMOSHINE A-4100). Then, the fluorine-based UV curable resin was cured by irradiation with the UV light at 600 mJ/cm$^2$, with the obtained nickel mold being pressed against the PET substrate. After curing of the resin, the nickel mold was peeled off from the cured resin. Accordingly, a diffraction grating mold made of the PET substrate with the resin film to which the surface profile of the nickel mold was transferred was obtained.

After the elapse of 60 seconds from the application of sol on the glass substrate by performing the bar coating, the diffraction grating mold was pressed against the coating film of the sol, by use of the pressing roll of which temperature was 30 degrees Celsius, while the pressing roll was moved and rotated, in the same manner as Example 1. After the completion of pressing against the coating film, the mold was manually peeled off from the substrate after the substrate was heated at a temperature of 100 degrees Celsius in the same manner as Example 1. Then, the substrate was subjected to the main baking by heating the substrate for 60 minutes in an oven of 300 degrees Celsius, and the pattern transferred to the coating film was evaluated.

An analysis image of the shape of the concavities and convexities on the surface of the coating film in the diffraction grating was obtained by use of an atomic force microscope (a scanning probe microscope equipped with an environment control unit "Nanonavi II Station/E-sweep" manufactured by SII NanoTechnology Inc.). Analysis conditions of the atomic force microscope were as follows.

Measurement mode: dynamic force mode
Cantilever: SI-DF40 (material: Si, lever width: 40 μm, diameter of tip of chip: 10 nm)
Measurement atmosphere: in air
Measurement temperature: 25 degrees Celsius <Average Height of Concavities and Convexities>

A concavity and convexity analysis image was obtained as described above by performing a measurement in a randomly selected measuring region of 3 μm square (length: 3 μm, width: 3 μm) in the diffraction grating. Distances between randomly selected concave portions and convex portions in the depth direction were measured at 100 points or more in the concavity and convexity analysis image, and the average of the distances was calculated as the average height (depth) of the concavities and convexities. The average height of the concavity and convexity pattern obtained by the analysis image in this example was 56 nm.

<Fourier-Transformed Image>

A concavity and convexity analysis image was obtained as described above by performing a measurement in a randomly selected measuring region of 3 μm square (length: 3 μm, width: 3 μm) in the diffraction grating. The obtained concavity and convexity analysis image was subjected to a flattening process including primary inclination correction, and then subjected to two-dimensional fast Fourier transform processing. Thus, a Fourier-transformed image was obtained. It was confirmed that the Fourier-transformed image showed a circular pattern substantially centered at an origin at which an absolute value of wavenumber was 0 μm$^{-1}$, and that the circular pattern was present within a region where the absolute value of wavenumber was in a range of 10 μm$^{-1}$ or less.

The circular pattern of the Fourier-transformed image is a pattern observed due to gathering of bright spots in the Fourier-transformed image. The term "circular" herein means that the pattern of the gathering of the bright spots looks like a substantially circular shape, and is a concept further including a case where a part of a contour looks like a convex shape or a concave shape. The gathering of the bright spots may look like a substantially annular shape, and this case is expressed as the term "annular". It is noted that the term "annular" is a concept further including a case where a shape of an outer circle or inner circle of the ring looks like a substantially circular shape and further including a case where a part of the contours of the outer circle and/or the inner circle of the ring looks like a convex shape or a concave shape. Further, the phrase "the circular or annular pattern is present within a region where an absolute value of wavenumber is in a range of 10 µm$^{-1}$ or less (more preferably from 1.25 to 10 µm$^{-1}$, further preferably from 1.25 to 5 µm$^{-1}$)" means that 30% or more (more preferably 50% or more, further more preferably 80% or more, and particularly preferably 90% or more) of bright spots forming the Fourier-transformed image are present within a region where the absolute value of wavenumber is in a range of 10 µm$^{-1}$ or less (more preferably from 1.25 to 10 µm$^{-1}$, and further preferably from 1.25 to 5 µm$^{-1}$). Regarding the relationship between the pattern of the concavity and convexity structure and the Fourier-transformed image, the followings have been appreciated. That is, in a case that the concavity and convexity structure itself has neither the pitch distribution nor the directivity, the Fourier-transformed image appears to have a random pattern (no pattern). In a case that the concavity and convexity structure is entirely isotropic in an XY direction and has the pitch distribution, a circular or annular Fourier-transformed image appears. In a case that the concavity and convexity structure has a single pitch, the annular shape appeared in the Fourier-transformed image tends to be sharp.

The two-dimensional fast Fourier transform processing on the concavity and convexity analysis image can be easily performed by electronic image processing by use of a computer equipped with software for the two-dimensional fast Fourier transform processing.

As a result of the image analysis of the obtained Fourier-transformed image, the wavenumber 2.38 µm$^{-1}$ was the most intensive. That is, the average pitch was 420 nm. The average pitch could be obtained as follows. For each of points of the Fourier-transformed image, the intensity and distance (unit: µm$^{-1}$) from the origin of the Fourier-transformed image were obtained. Then, the average value of the intensity was obtained for the points each having the same distance from the origin. As described above, a relationship between the distance from the origin of the Fourier-transformed image and the average value of the intensity was plotted, a fitting with a spline function was carried out, and the wavenumber of the peak intensity was regarded as the average wavenumber (µm$^{-1}$). For the average pitch, it is allowable to make a calculation by another method, for example, a method for obtaining the average pitch of the concavities and convexities as follows. That is, a concavity and convexity analysis image is obtained by performing a measurement in a randomly selected measuring region of 3 µm square (length: 3 µm, width: 3 µm) in the diffraction grating, then the distances between randomly selected adjacent convex portions or between randomly selected adjacent concave portions are measured at 100 points or more in the concavity and convexity analysis image, and then an average of these distances is determined.

<Manufacture of Organic EL Element>

The glass substrate with the pattern made of the sol-gel material layer as the diffraction grating obtained as described above was cleaned with a brush to remove foreign matter and the like adhered thereto, then organic matter and the like was removed by an alkaline cleaner and an organic solvent. On the substrate cleaned as described above, a film of ITO having a thickness of 120 nm was formed at a temperature of 300 degrees Celsius by a sputtering method. A photoresist was applied and an exposure was performed with an electrode mask pattern, and then an etching was performed by a developer. Accordingly, a transparent electrode having a predetermined pattern was obtained. The obtained transparent electrode was cleaned with the brush, and the organic matter and the like was removed by the alkaline cleaner and the organic solvent. Then, the transparent electrode was subjected to a UV-ozone process. On the transparent electrode processed as described above, a hole transporting layer (4,4',4"tris(9-carbazole)triphenylamine, thickness: 35 nm), a light emitting layer (tris(2-phenylpyridinato)iridium(III) complex-doped 4,4',4"tris(9-carbazole)triphenylamine, thickness: 15 nm; tris (2-phenylpyridinato)iridium(III) complex-doped 1,3,5-tris (N-phenylbenzimidazole-2-yl)benzene, thickness: 15 nm), an electron transporting layer (1,3,5-tris(N-phenylbenzimidazole-2-yl)benzene, thickness: 65 nm), and a lithium fluoride layer (thickness: 1.5 nm) were each stacked by a vapor deposition method, and further a metal electrode (aluminum, thickness: 50 nm) was formed by the vapor deposition method. Accordingly, the organic EL element in which the concavity and convexity structure was maintained was obtained as shown in FIG. 13.

In the process as described above, the substrate produced in accordance with the method of the present invention was formed of the sol-gel material and had the superior mechanical strength. Thus, even when the cleaning with the brush was performed for the substrate and the surface of the concavity and convexity pattern after formation of the transparent electrode as described above, damage, adhesion of the foreign matter, projection on the transparent electrode and the like were less likely to occur, and thereby any element failure therefrom could be suppressed. Therefore, the organic EL element obtained by the method of the present invention was superior, as compared with a case in which a curable resin substrate was used, in terms of the mechanical strength of the substrate having the concavity and convexity pattern. Further, the substrate made of the sol-gel material produced in accordance with the method of the present invention had a satisfactory chemical resistance and the alkali resistance superior to the substrate formed of a curable resin material. Therefore, the substrate had a certain corrosion resistance to alkaline fluid and the organic solvent used for the cleaning step of the substrate and the transparent electrode, and thus it is possible to use various cleaning liquids. Further, an alkaline developer is used at the time of the patterning of the transparent substrate in some cases, and the substrate in the present invention also has the corrosion resistance to such a developer. In this respect, the substrate in the present invention has an advantage over the curable resin substrate having a generally low resistance in the alkaline fluid. Further, the substrate formed of the sol-gel material produced in accordance with the method of the present invention has a superior UV resistance and a superior weather resistance as compared with the curable resin substrate. Therefore, the substrate in the present invention also has the resistance to the UV-ozone cleaning process after the formation of the transparent electrode. Further, in a case that the organic EL element produced by the method of the present invention is used outside or outdoors, it is possible to suppress the deterioration due to sunlight as compared with the case in which the curable resin substrate is used.

<Evaluation of Light Emission Efficiency of Organic EL Element>

The light emission efficiency of the organic EL element obtained in this example was measured by the following method. That is, a voltage was applied to the obtained organic EL element, and then the applied voltage V and a current I flowing through the organic EL element were measured with a source measurement instrument (manufactured by ADC CORPORATION, R6244), and a total luminous flux amount L was measured with a total flux measurement apparatus manufactured by Spectra Co-op. From the thus obtained measured value of the applied voltage V, the current I, and the total luminous flux amount L, a luminance value L' was calculated. Here, for the current efficiency, the following calculation formula (F1) was used:

$$\text{Current efficiency} = (L'/I) \times S \quad (F1)$$

and, for the power efficiency, the following calculation formula (F2) was used:

$$\text{Power efficiency} = (L'/I/V) \times S \quad (F2)$$

Accordingly, the current efficiency and the power efficiency of the organic EL element were calculated. In the above formulae, S is a light-emitting or luminescent area of the element. Noted that the value of the luminance L' was calculated on the assumption that light distribution characteristic of the organic EL element followed Lambert's law, and the following calculation formula (F3) was used:

$$L' = L/\pi/S \quad (F3)$$

The current efficiency of the organic EL element of this example at a luminance of 1000 cd/m² was about 1.4 times that of the organic EL element having no concavities and convexities on the glass substrate. Further, the power efficiency of the organic EL element of this example at a luminance of 1000 cd/m² was about 1.6 times that of the organic EL element having no concavities and convexities on the glass substrate. Therefore, the organic EL element of the present invention had a sufficient external extraction efficiency.

<Evaluation of Light Emission Directivity of Organic EL Element>

The directivity of light emission of the organic EL element obtained in this example was evaluated by the following method. That is, the organic EL element in a luminescent state was visually observed in all the directions (directions of all around 360°). Neither particularly bright sites nor particularly dark sites were observed when the organic EL element obtained in Example 3 was observed in any of the directions of all around 360°, and the brightness was uniform in all the directions. In this way, it was shown that the directivity of light emission of the organic EL element of the present invention was sufficiently low.

Example 4

Example 4 was performed in the same manner as Example 1, except that a roll, which was provided with a heater therein and had the outer periphery covered with heat-resistant silicone of a thickness of 4 mm (roll diameter (φ): 50 mm, length in an axial direction of the shaft: 350 mm), was used as the pressing roll and that the pressing roll was heated to a temperature of 80 degrees Celsius. That is, the sol was prepared and applied on the soda-lime glass plate by the bar coating. The mold having the line-and-space pattern was pressed against the coating film on the glass plate by use of the heated pressing roll for each elapsed time after the application of the sol. Then, the mold was peeled off from the coating film.

After peeling off the mold, the transfer state of the line-and-space pattern on the coating film was observed visually. When the line-and-space pattern on the coating film could be observed, it was evaluated as transferable. The evaluation results are shown in Table 3. Table 3 shows the time elapsed after the application and before the pressing; the weight of the coating film; the ratio of weight of the coating film to the dried weight; and the evaluation results. In a case that the line-and-space pattern was clearly transferred on the coating film, it is expressed as "+" and in a case that no line-and-space pattern was observed and evaluated as transfer failure, it is expressed as "−" in each column of Table 3.

TABLE 3

| Time elapsed after application (second) | Weight of coating film (mg) | Weight ratio to dried film (*1) | Evaluation |
|---|---|---|---|
| 10 | | | |
| 20 | 75.3 | 8.76 | − |
| 30 | 66.1 | 7.69 | − |
| 40 | 57.5 | 6.69 | − |
| 50 | 50.3 | 5.85 | − |
| 60 | 43.8 | 5.09 | − |
| 70 | 38.6 | 4.49 | + |
| 80 | 33.7 | 3.92 | + |
| 90 | 29.6 | 3.44 | + |
| 100 | 26.0 | 3.02 | + |
| 110 | 23.0 | 2.67 | + |
| 120 | 20.6 | 2.40 | + |
| 130 | 18.6 | 2.16 | + |
| 140 | 17.2 | 2.00 | + |
| 150 | 15.9 | 1.85 | + |
| 160 | 14.9 | 1.73 | + |
| 170 | 14.2 | 1.65 | + |
| 180 | 13.6 | 1.58 | + |
| 190 | 13.2 | 1.53 | + |
| 200 | 12.8 | 1.49 | + |
| 210 | 12.6 | 1.47 | + |
| 220 | 12.5 | 1.45 | + |
| 230 | 12.3 | 1.43 | + |
| 240 | 12.1 | 1.41 | + |
| 250 | 11.9 | 1.38 | − |
| 260 | 11.7 | 1.36 | − |
| 270 | 11.6 | 1.35 | − |
| 280 | 11.5 | 1.34 | − |
| 290 | 11.4 | 1.33 | − |
| 300 | 11.2 | 1.30 | − |
| 310 | 11.2 | 1.30 | − |
| Drying at 100 deg C. for 5 minutes | 8.60 | 1.00 | |

(*1) The weight of the film dried at 100 degrees Celsius for 5 minutes was defined as 1

The results in Table 3 show that the transfer was satisfactory in a case that the ratio of weight of the coating film to the dried weight was in a range of 1.4 to 4.5. That is, in terms of the time elapsed after the application, the transfer was satisfactory in a case that the elapsed time was in a range of 70 seconds to 240 seconds. Note that in a case that the weight exceeded 4.0, the sol applied by the bar coater flowed and leaked from the substrate, so that the sol came around behind the substrate. This made an area around the substrate dirty.

Of the glass substrates each having the coating film to which the line-and-space pattern was transferred, the substrate(s) to which the line-and-space pattern was clearly transferred was(were) subjected to a main baking by heating the substrate(s) for 60 minutes in an oven of 300 degrees Celsius.

Example 5

Figure 16:
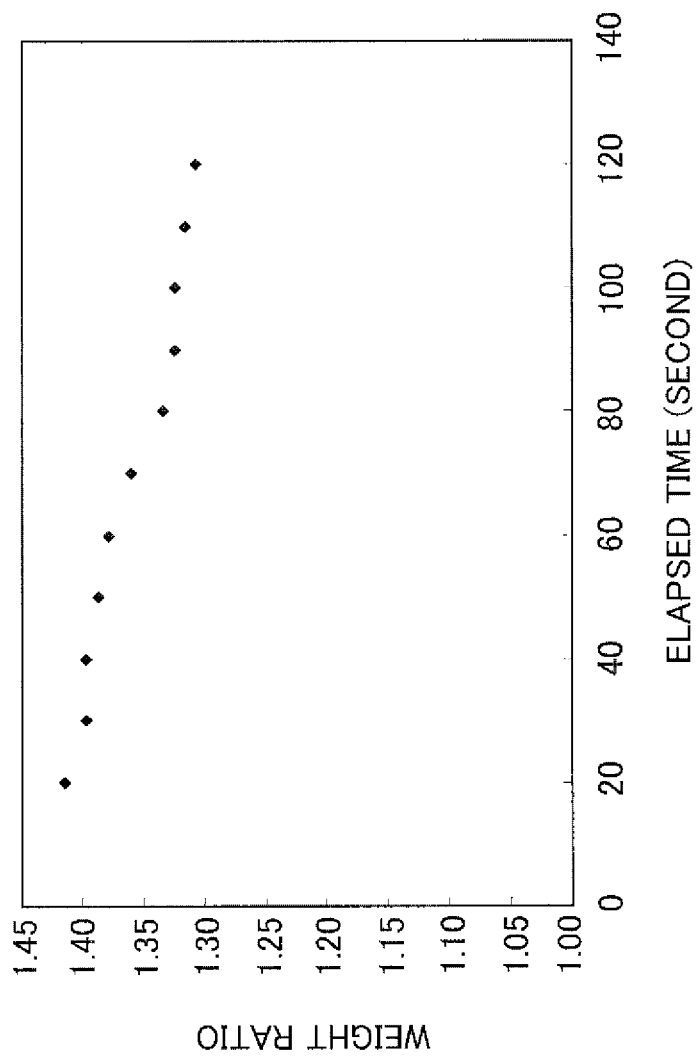
FIG. 16 is a graph showing a relationship between the time elapsed after a sol is applied on a glass substrate by use of a spin coater and the ratio of weight of a coating film to dried weight of the coating film in Example 5.

Example 5 was performed in the same manner as Example 4, except that the sol was applied by the spin coating method instead of the bat coating method. The spin coating was performed at a spin speed of 500 rpm for 8 seconds, and then performed at a spin speed of 1000 rpm for 3 seconds. The weight of the glass substrate was weighed for each elapsed time after the spin coating in the same manner as Example 4. Then, it was obtained the ratio of weight of the glass substrate to the weight (dried weight) of the substrate, which was obtained by heating the substrate at a temperature of 100 degrees Celsius for 5 minutes. FIG. 16 shows the variation of the ratio (e=b(t)/a) of weight of the coating film to the dried weight of the coating film for each elapsed time after the spin coating. Subsequently, the mold was pressed against the coating film of the sol which was obtained by performing the spin coating on the glass substrate, by use of the pressing roll which was provided with the heater therein and of which temperature was 80 degrees Celsius, while the pressing roll was moved and rotated, for each elapsed time in the same manner as Example 4. After the completion of pressing against the coating film, the mold was manually peeled off from the substrate in the same manner as Example 4. Then, the pattern transferred to the coating film was observed and evaluated.

Table 4 shows the evaluation results. The following is understood from the results. That is, even when the sol is applied by using the spin coater, the transfer can be performed satisfactorily provided that the ratio "e" of weight of the coating film to the dried weight of the coating film is not less than 1.4.

TABLE 4

| Solvent | Ethanol | | |
| --- | --- | --- | --- |
| Time elapsed after application | Weight of coating film (mg) | Weight ratio to dried film (*1) | Evaluation |
| 10 | | | |
| 20 | 15.7 | 1.41 | + |
| 30 | 15.5 | 1.40 | + |
| 40 | 15.5 | 1.40 | + |
| 50 | 15.4 | 1.39 | − |
| 60 | 15.3 | 1.38 | − |
| 70 | 15.1 | 1.36 | − |
| 80 | 14.8 | 1.33 | − |
| 90 | 14.7 | 1.32 | − |
| 100 | 14.7 | 1.32 | − |
| 110 | 14.6 | 1.32 | − |
| 120 | 14.5 | 1.31 | − |
| Drying at 100 deg C. for 5 minutes | 11.1 | 1.00 | |

| Solvent | Isopropyl alcohol | | |
| --- | --- | --- | --- |
| Time elapsed after application | Weight of coating film (mg) | Weight ratio to dried film (*1) | Evaluation |
| 10 | | | |
| 20 | 14.0 | 1.49 | + |
| 30 | 13.9 | 1.48 | + |
| 40 | 13.7 | 1.46 | + |
| 50 | 13.6 | 1.45 | + |
| 60 | 13.5 | 1.44 | + |
| 70 | 13.3 | 1.41 | + |
| 80 | 13.2 | 1.40 | + |
| 90 | 13.1 | 1.39 | − |
| 100 | 13.0 | 1.38 | − |
| 110 | 12.9 | 1.37 | − |
| 120 | 12.9 | 1.37 | − |
| Drying at 100 deg C. for 5 minutes | 9.40 | 1.00 | |

(*1) The weight of the film dried at 100 degrees Celsius for 5 minutes was defined as 1.

Example 6

Example 6 was performed in the same manner as Example 5, excepted that 31.7 g of isopropyl alcohol (IPA) was used instead of ethanol used in the sol. That is, the sol was prepared and applied on the glass substrate by the spin coating, and the mold having the line-and-space pattern was pressed against the coating film on the glass substrate using the heated pressing roll every time when a predetermined period of time elapses. The variation of the ratio (e=b(t)/a) of weight of the coating film to the dried weight of the coating film for each elapsed time after the application was the same as that shown in the graph of FIG. 15. The evaluation results are shown in Table 4. The following is understood from the results. That is, even when the isopropyl alcohol is used as the solvent of the sol, the transfer can be performed satisfactorily provided that the ratio of weight of the coating film to the dried weight of the coating film is not less than 1.4.

Example 7

The diffraction grating mold made of the PET substrate with the resin film to which the surface profile of the nickel mold was transferred was obtained in the same manner as Example 3. After the elapse of 60 seconds from the application of sol on the glass substrate by performing the bar coating on the glass substrate, the diffraction grating mold was pressed against the coating film of the sol, by use of the pressing roll which was heated to 80 degrees Celsius, while the pressing roll was moved and rotated, in the same manner as Example 4. After the completion of pressing against the coating film, the mold was manually peeled off from the substrate in the same manner as Example 4. Then, the substrate was subjected to the main baking by heating the substrate for 60 minutes in an oven of 300 degrees Celsius, and the pattern of the diffraction grating transferred to the coating film was evaluated. An analysis image of the shape of the concavities and convexities on the surface of the coating film in the diffraction grating was obtained by using the atomic force microscope (the scanning probe microscope equipped with the environment control unit "Nanonavi II Station/E-sweep" manufactured by SII NanoTechnology Inc.) in the same manner as Example 3. Analysis conditions of the atomic force microscope were the same as those in Example 3.

<Average Height of Concavities and Convexities>

A concavity and convexity analysis image was obtained in the same manner as Example 3 by performing a measurement in a randomly selected measuring region of 3 μm square (length: 3 μm, width: 3 μm) in the diffraction grating. The average height of the concavity and convexity pattern obtained by the analysis image in this example was 56 nm.

<Fourier-Transformed Image>

A concavity and convexity analysis image was obtained in the same manner as Example 3 by performing a measurement in a randomly selected measuring region of 3 μm square (length: 3 μm, width: 3 μm) in the diffraction grating. The obtained concavity and convexity analysis image was subjected to the process which was the same as that in Example 3 to obtain a Fourier-transformed image. It was confirmed that the Fourier-transformed image showed a circular pattern substantially centered at an origin at which an absolute value of wavenumber was 0 μm$^{-1}$, and that the circular pattern was present within a region where the absolute value of wavenumber was in a range of 10 μm$^{-1}$ or less. As a result of the image analysis of the obtained Fourier-transformed image, the wavenumber 2.38 μm$^{-1}$ was the most intensive. That is, the average pitch was 420 nm.

<Manufacture of Organic EL Element>

The organic EL element in which the concavity and convexity structure was maintained as shown in FIG. 13 was manufactured by the same process as Example 3 by use of the glass substrate with the pattern made of the sol-gel material layer as the diffraction grating obtained as described above.

<Evaluation of Light Emission Efficiency of Organic EL Element>

The light emission efficiency of the organic EL element obtained in this example was measured in the same manner as Example 3. It was found that the current efficiency of the organic EL element of this example at a luminance of 1000 cd/m$^2$ was about 1.7 times that of the organic EL element having no concavities and convexities on the glass substrate. Further, it was found that the power efficiency of the organic EL element of this example at a luminance of 1000 cd/m$^2$ was about 2.1 times that of the organic EL element having no concavities and convexities on the glass substrate. Therefore, the organic EL element of the present invention had an external extraction efficiency sufficiently.

<Evaluation of Light Emission Directivity of Organic EL Element>

The directivity of light emission of the organic EL element obtained in this example was evaluated by the same method as Example 3. Neither particularly bright sites nor particularly dark sites were observed when the organic EL element obtained in this example was observed in any of the directions of all around 360°, and the brightness was uniform in all the directions. In this way, it was shown that the directivity of light emission of the organic EL element of the present invention was sufficiently low.

As described above, the temperature at the time of forming the film of the transparent electrode (ITO) of the organic EL element in each of Examples 3 and 7 was 300 degrees Celsius. Although it is allowable that the temperature at the time of forming the film of the transparent electrode is lower than 300 degrees Celsius, the transparent electrode is desired to have a low resistivity, and the film formation is preferably performed at a high temperature to increase crystallinity. In a case that the temperature during the film formation is low, which is about 100 degrees Celsius, the ITO film formed on the substrate is relatively amorphous and has an inferior specific resistance, and an adhesion property between the substrate and the ITO thin film is inferior. Although the concavity and convexity pattern formed of a general UV curable resin and the like had difficulty in withstanding a film formation step at a high temperature, the concavity and convexity pattern can be applied even in the film formation step at a high temperature by using the sol-gel material which is an example of ceramic. Therefore, the method of the present invention is also suitable for producing the substrate (diffraction grating) for the organic EL element. Further, in a case that the curable resin as described above is kept for a long period under a high temperature because of, for example, the generation of heat at the time of emitting light, there is fear that the curable resin deteriorates to cause yellow discoloration and/or generate gas. Thus, it is difficult to use the organic EL element using the resin substrate for a long period of time. In contrast, the organic EL element provided with the substrate made of the sol-gel material is less likely to deteriorate.

Example 8

Example 8 was performed in the same manner as Example 7, except that the pressing roll, which was heated to 40 degrees Celsius, was used. As a result, the pattern could be transferred similarly to Example 7, and it was confirmed that the average height of the concavity and convexity pattern was 56 nm and the average pitch was 420 nm. The organic EL element was manufactured and the light emission efficiency of the organic EL element was measured in the same manner as Example 7. It was found that the current efficiency of the organic EL element of this example at a luminance of 1000 cd/m$^2$ was about 1.7 times that of the organic EL element having no concavities and convexities on the glass substrate. Further, it was found that the power efficiency of the organic EL element of this example at a luminance of 1000 cd/m$^2$ was about 2.1 times that of the organic EL element having no concavities and convexities on the glass substrate. Therefore, the organic EL element of the present invention had an external extraction efficiency sufficiently.

Example 9

Example 9 was performed in the same manner as Example 7, except that the pressing roll, which was heated to 150 degrees Celsius, was used. As a result, the pattern could be transferred similarly to Example 7, and it was confirmed that the average height of the concavity and convexity pattern was 56 nm and the average pitch was 420 nm.

The organic EL element was manufactured and the light emission efficiency of the organic EL element was measured in the same manner as Example 7. It was found that the current efficiency of the organic EL element of this example at a luminance of 1000 cd/m$^2$ was about 1.7 times that of the organic EL element having no concavities and convexities on the glass substrate. Further, it was found that the power efficiency of the organic EL element of this example at a luminance of 1000 cd/m$^2$ was about 2.1 times that of the organic EL element having no concavities and convexities on the glass substrate. Therefore, the organic EL element of the present invention had an external extraction efficiency sufficiently.

Example 10

The diffraction grating was manufactured in the same manner as Example 7, except that the pressing roll, which was heated to 25 degrees Celsius, was used. As a result, the pattern could be transferred similarly to Example 7, and the average height of the concavity and convexity pattern was 56 nm and the average pitch was 420 nm. However, the peeling of the mold from the coating film took a longer time than that of Example 7.

Comparative Example 1

Comparative Example 1 was performed in the same manner as Example 3, except that the time elapsed after the application and before the pressing was set to 250 seconds. As a result, no pattern was transferred.

The organic EL element was manufactured and the light emission efficiency of the organic EL element was measured in the same manner as Example 3. It was found that the current efficiency of the organic EL element of this comparative example at a luminance of 1000 cd/m$^2$ was about 1.0 times that of the organic EL element having no concavities and convexities on the glass substrate. Further, it was found that the power efficiency of the organic EL element of this comparative example at a luminance of 1000 cd/m$^2$ was about 1.0 times that of the organic EL element having no concavities and convexities on the glass substrate.

Comparative Example 2

Comparative Example 2 was performed in the same manner as Example 7, except that the time elapsed after the application and before the pressing was set to 250 seconds. As a result, no pattern was transferred. The organic EL element was manufactured and the light emission efficiency of the organic EL element was measured in the same manner as Example 7. It was found that the current efficiency of the organic EL element of this comparative example at a luminance of 1000 cd/m² was about 1.0 times that of the organic EL element having no concavities and convexities on the glass substrate. Further, it was found that the power efficiency of the organic EL element of this comparative example at a luminance of 1000 cd/m² was about 1.0 times that of the organic EL element having no concavities and convexities on the glass substrate.

In the above description, the present invention was explained by using Examples. The method of the present invention, however, is not limited to the methods described in Examples, and can be appropriately modified within technical idea described in the claims. For example, the pattern was transferred by using the mold and the pressing roll, each of which had a specific material, a specific size, and a specific structure in the above Examples. The present invention, however, is not limited thereto, and it is possible to use a mold and a pressing roll, each of which adopts any material, any size, and any structure. Further, the film of the organic layer was formed by the vapor deposition method when the organic EL element was manufactured in the above description. However, either the vapor deposition method or any known application method such as a spin coating can be employed as a method for stacking the organic layer. Furthermore, the sol (sol-gel solution) having a specific composition was used when the film of the sol-gel material was formed in the above description. However, the sol can be prepared to have any composition, and any additive can be added without departing from the scope of the present invention.

According to the present invention, it is possible to reliably produce a substrate having a relatively large area, in which a concavity and convexity pattern is formed, with high production efficiency. Therefore, the present invention is suitable for producing various types of optical elements including a diffraction-grating substrate for an organic EL element, a wire grid polarizer, an antireflection film, an optical element for a solar cell, etc., in particular, a large-size optical element. Further, the concavity and convexity pattern in the substrate was made of silica by a sol-gel process and thus the concavity and convexity pattern has the resistance to a relatively high temperature. Therefore, it is possible to produce an organic EL element having high performance at a high yield.

What is claimed is:

1. A method for producing a substrate having a concavity and convexity pattern, comprising:
    a step of applying a sol, which contains a silica precursor, on a substrate to form a coating film;
    a step of drying the coating film;
    a step of pressing a mold having a concavity and convexity pattern against the dried coating film with a pressing roll so that the concavity and convexity pattern is pressed onto the coating film;
    a step of peeling off the mold from the coating film; and
    a step of baking the coating film to which the concavity and convexity pattern has been transferred,
    wherein the coating film is dried in the drying step so that a ratio of weight of the coating film to dried weight of the coating film is in a range of 1.4 to 8.8, the dried weight being obtained by baking the coating film at a temperature of 100 degrees Celsius.

2. The method for producing the substrate having the concavity and convexity pattern according to claim 1, wherein, in the step of pressing the concavity and convexity pattern against the coating film, the mold having the concavity and convexity pattern is pressed against the dried coating film with the pressing roll while the dried coating film is heated.

3. The method for producing the substrate having the concavity and convexity pattern according to claim 2, wherein the coating film is dried in the drying step so that the ratio of the weight of the coating film to the dried weight of the coating film is in a range of 1.4 to 4.5, the dried weight being obtained by baking the coating film at the temperature of 100 degrees Celsius.

4. The method for producing the substrate having the concavity and convexity pattern according to claim 1, wherein the pressing roll includes a heater.

5. The method for producing the substrate having the concavity and convexity pattern according to claim 4, wherein the pressing roll is heated to temperatures of 40 degrees Celsius to 150 degrees Celsius by the heater.

6. The method for producing the substrate having the concavity and convexity pattern according to claim 1, wherein the sol contains one kind of metal alkoxide or a several kinds of metal alkoxides.

7. The method for producing the substrate having the concavity and convexity pattern according to claim 6, wherein the sol contains a mixture of tetraethoxysilane (TEOS) and methyltriethoxysilane (MTES).

8. The method for producing the substrate having the concavity and convexity pattern according to claim 1, further comprising a step for pre-baking the coating film after the concavity and convexity pattern is pressed against the coating film and before the mold is peeled off from the coating film.

9. The method for producing the substrate having the concavity and convexity pattern according to claim 1, wherein a peeling roll is used to peel off the mold from the coating film.

10. The method for producing the substrate having the concavity and convexity pattern according to claim 9, wherein the mold is peeled off from the coating film while the peeling roll is heated.

11. The method for producing the substrate having the concavity and convexity pattern according to claim 1, wherein an average pitch of concavities and convexities on the concavity and convexity pattern is in a range of 100 nm to 900 nm and an average height of the concavities and convexities is in a range of 20 nm to 200 nm.

12. The method for producing the substrate having the concavity and convexity pattern according to claim 1, wherein the mold having the concavity and convexity pattern is a flexible mold.

13. The method for producing the substrate having the concavity and convexity pattern according to claim 12, wherein the flexible mold is a long mold having a length longer than that of the substrate, and the long mold is pressed against the coating film with the pressing roll while the long mold is transported by using a feeding roll which feeds the long mold and a winding roll which rolls up the long mold thereon.

14. A method for producing an organic EL element, wherein a diffraction-grating substrate having a concavity and convexity surface is manufactured by the method for producing the substrate having the concavity and convexity pattern as defined in claim 1; and
    a transparent electrode, an organic layer, and a metal electrode are stacked in this order on the concavity and convexity surface of the diffraction-grating substrate, thereby producing the organic EL element.

15. An organic EL element which is obtained by the method as defined in claim 14 to include a transparent electrode, an organic layer, and a metal electrode on a diffraction-grating substrate having a concavity and convexity surface, wherein the diffraction-grating substrate has a substrate having no concavity and convexity pattern and a silica layer having a concavity and convexity pattern formed directly on the substrate having no concavity and convexity pattern.

16. The organic EL element according to claim 15, wherein the substrate is a substrate made of an inorganic material.

* * * * *